United States Patent
Fukumura

(10) Patent No.: US 6,894,662 B2
(45) Date of Patent: May 17, 2005

(54) PHOTOELECTRIC SWITCH

(75) Inventor: Koji Fukumura, Osaka (JP)

(73) Assignee: Keyence Corporation, Osaka (JP)

( * ) Notice: Subject to any disclaimer, the term of this patent is extended or adjusted under 35 U.S.C. 154(b) by 370 days.

(21) Appl. No.: 10/076,436

(22) Filed: Feb. 19, 2002

(65) Prior Publication Data

US 2002/0130822 A1 Sep. 19, 2002

(30) Foreign Application Priority Data

Mar. 15, 2001 (JP) ........................................ 2001-073339

(51) Int. Cl.$^7$ ................................................. H01J 5/02
(52) U.S. Cl. ...................... 345/1.1; 345/1.2; 345/156; 345/165; 345/166; 345/204; 345/207; 340/556; 340/557; 340/815.44; 340/815.45; 376/259
(58) Field of Search ........................ 345/1.1, 1.2, 156, 345/165, 166, 204, 207; 340/556, 557; 815.44, 815.45; 376/259

(56) References Cited

U.S. PATENT DOCUMENTS

| | | | |
|---|---|---|---|
| 4,501,485 A | * | 2/1985 | Tsudaka ...................... 399/79 |
| 4,766,306 A | * | 8/1988 | Bichsel et al. .......... 250/227.21 |
| 5,347,117 A | | 9/1994 | Fooks et al. |
| 5,604,386 A | * | 2/1997 | Nagai et al. ................ 307/118 |
| 6,011,467 A | * | 1/2000 | Kamei et al. ............... 340/540 |
| 6,084,524 A | | 7/2000 | Sato |
| 6,211,784 B1 | | 4/2001 | Nishide |
| 6,339,465 B1 | * | 1/2002 | Takanashi et al. ............. 355/18 |

FOREIGN PATENT DOCUMENTS

| | | |
|---|---|---|
| EP | 797 107 A | 9/1997 |
| JP | 7-92266 A | 4/1995 |
| JP | 9-252242 A | 9/1997 |

OTHER PUBLICATIONS

Exercise Aiding Device; JP 11137720, Toshima, Akio; Pub. Date May 25, 1999 (11–137720).*
Optical Touch Switch; JP 6319218, Yabuuchi, Masami; Pug. Date Aug. 8, 1988 (63–191218).*

* cited by examiner

*Primary Examiner*—Bipin Shalwala
*Assistant Examiner*—Vincent E. Kovalick
(74) *Attorney, Agent, or Firm*—Smith Patent Office

(57) ABSTRACT

A multifunctional photoelectric switch comprises a display section for displaying a first display information and a second display information. The first display information includes a plurality of items concerning a threshold value and the second display information includes a plurality of items concerning functions of the photoelectric switch. A switch is provided for switching information to be displayed on the display section between each type of display information. A selection menu for the user to select either "Easy" or "Pro" is displayed in the progress of making a transition from a "light reception amount and/or threshold value display" mode of the basic display information to an "operation function setting" mode of the second display information. The user selects and sets either "Easy" or "Pro" on the selection screen. In the "Pro" mode, the set items concerning all functions are displayed; in the "Easy" mode, only the basic items are displayed.

20 Claims, 36 Drawing Sheets

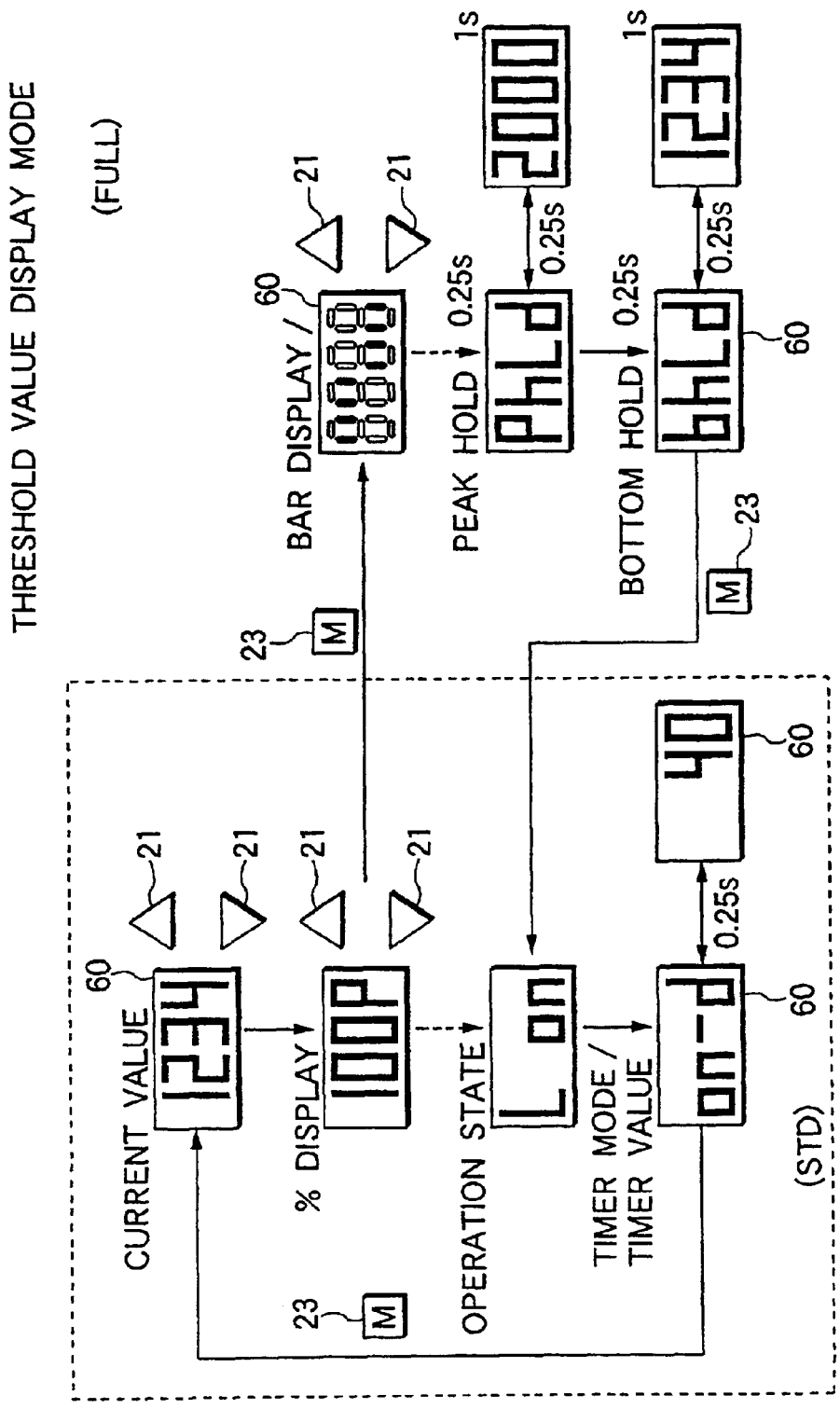

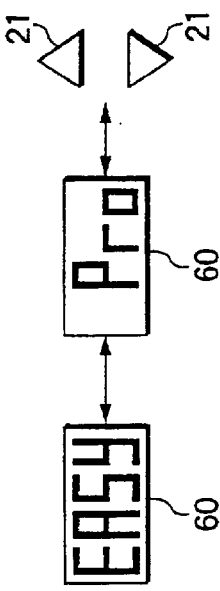
FIG.33 ("OPERATION MODE SETTING" DISPLAY)
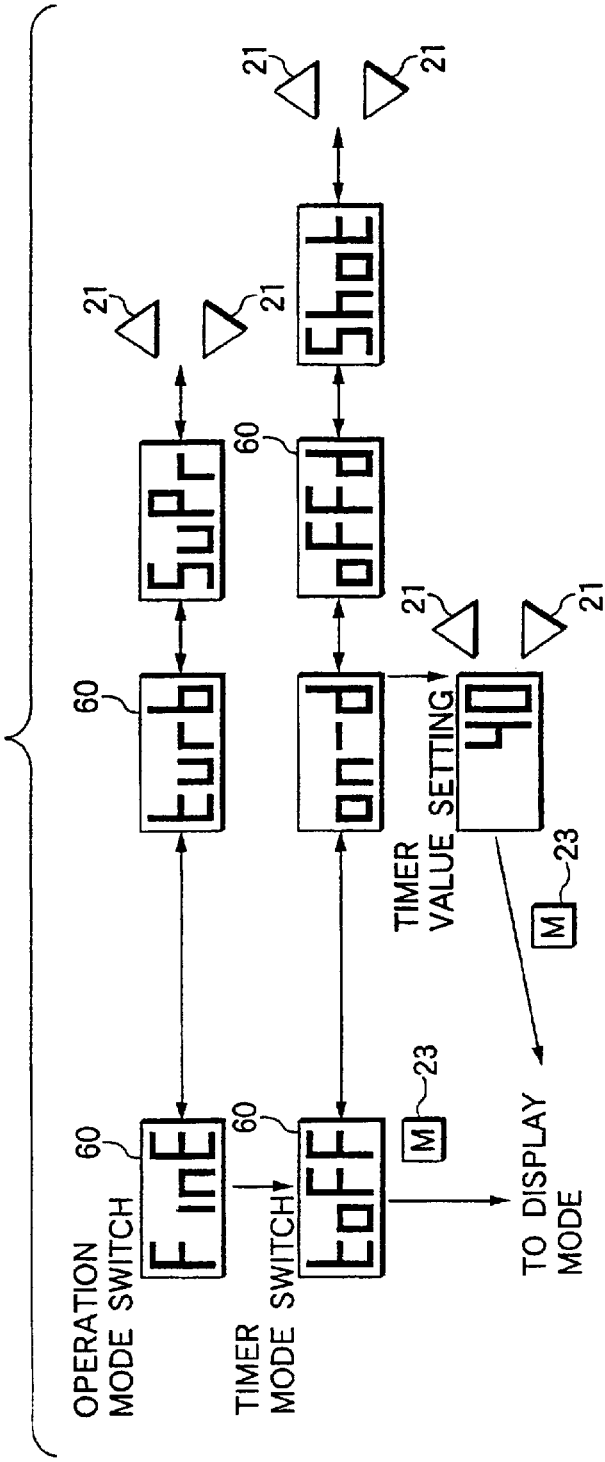
FIG.34

PHOTOELECTRIC SWITCH

BACKGROUND OF THE INVENTION

1. Field of the Invention

This invention relates to a photoelectric switch, and in particular to a photoelectric switch having a display section.

2. Discussion of the Related Art

A photoelectric switch is used to detect the presence or absence of a detected object on the manufacturing premise, as for example, in a production inspection step. The demands for the manufacturing premises to make industrial products, such as miniaturization, manufacturing cost reduction, quality improvement, etc., are increasingly severe with each passing year. In such an environment, the performance required for various sensors or switches is also becoming higher and the demands for higher functionability stronger. The demand for saving space affects the photoelectric switch and additional miniaturization of the electric switch is always needed.

Some known photoelectric switches in the related arts comprise a display section. In this kind of photoelectric switch, for example, while a threshold value is displayed, a switch or a button can be pressed to finely adjust the setup threshold value.

When a large number of functions are set or adjusted, the number of times a button or a switch is operated is increased to display information concerning the setting or adjusting. If the spacing between adjacent buttons or switches becomes narrower with miniaturization, the problem of erroneous operation is always involved. Once an erroneous operation is performed, to start again from the beginning, a button or a switch is repetitively pressed to return to the initial display item and further a button or a switch must be pressed multiple times to return to the problem display item. This extremely burdensome work is forced on the user.

SUMMARY OF THE INVENTION

It is therefore a first object of the invention to provide a photoelectric switch having a large number of user functions with a limited number of switches or buttons.

It is a second object of the invention to provide a photoelectric switch which makes it possible to reduce the number of times a button or a switch is pressed to adjust the photoelectric switch while displaying multifunctional data.

It is a third object of the invention to provide a photoelectric switch that would appear to the typical user as if it were limited to the frequently used functions of operation even though the photoelectric switch would be, in fact, multifunctional.

It is a fourth object of the invention to provide a multifunctional photoelectric switch that can be easily used by a wide range of users regardless of the user's familiarity with handling a photoelectric switch.

The above-mentioned objects can be achieved by a multifunctional photoelectric switch having a display section, according to the present invention, wherein information concerning the photoelectric switch can be displayed in the display section and the display contents of the display information can be changed or adjusted. The photoelectric switch comprises: a display section for displaying one of a first display information and a second display information, the first display information including a plurality of items concerning a threshold value, the second display information including a plurality of items concerning functions of the photoelectric switch; a switch for switching information to be displayed on the display section between the first display information and the second display information, and wherein when the second display information is displayed on the display section, only a part of the plurality of items or all of the plurality of items in the second display information are sequentially displayed on the display section.

In the above-mentioned photoelectric switch, it is preferable that when the first display information is displayed on the display section, only some of the items or all of the items of the first display information are displayed on the display section.

Further, in the above-mentioned photoelectric switch, it is preferable that the user can select some of items or the all of the items in the second display information to display the selected items on the display section. When the choice, some of the items, is selected, only some functions of the photoelectric switch are displayed. The items related to the basic operational settings of the photoelectric switch and/or relatively frequently used items may be adopted as the items displayed in the choice, some of the items.

In the above-mentioned photoelectric switch, it is also preferable that according to the selection by the user, all of the items can be displayed, or on the other hand, only a limited number of items can be displayed. In such a situation, if a general user causes the photoelectric switch to display only limited items, the photoelectric switch does not display items whose setting is not required and the user can thus complete setting the photoelectric switch by matching the detection environment and not by the cumbersome operation equivalent with that of a photoelectric switch with only limited functions.

On the other hand, if the user has extensive knowledge of a photoelectric switch and can fully use the photoelectric switch, he or she can display all items in the display section of the photoelectric switch for setting or adjusting all of the functions of the multifunctional photoelectric switch as the user desires.

BRIEF DESCRIPTION OF THE DRAWINGS

The above and other objects and features of the present invention will be clearly understood from the following description with respect to the preferred embodiment thereof when considered in conjunction with the accompanying drawings and diagrams, in which:

FIG. 32 is a drawing showing the display form in the second display information and the flow of display items thereon in a specific example to describe the fact that the invention can be applied to a photoelectric switch comprising one display section;

FIG. 33 is a drawing showing a step of conducting the mode selection concerning the display in the second information display as with the first embodiment only with one display section;

FIG. 34 is a drawing showing the display form and the flow of display items in an "Easy" mode like that of the first embodiment but with only one display section;

DETAILED DESCRIPTION OF THE PREFERRED EMBODIMENTS

Referring now to the accompanying drawings, the preferred embodiments of the invention are shown.

Figure 1:
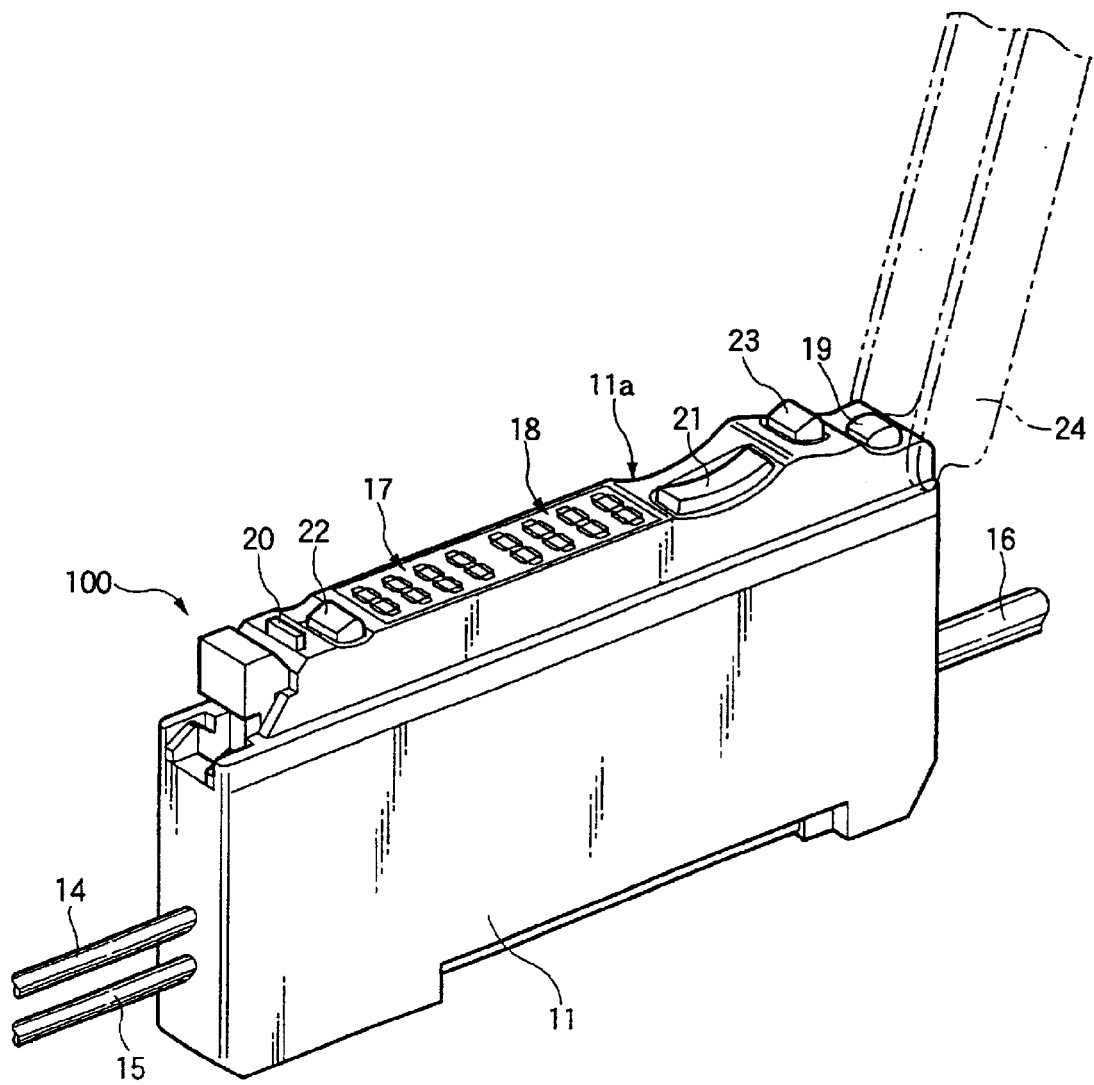
FIG. 1 is a perspective view of a reflection-type photoelectric switch with a dual monitor according to a first embodiment of the present invention.
Figure 2:
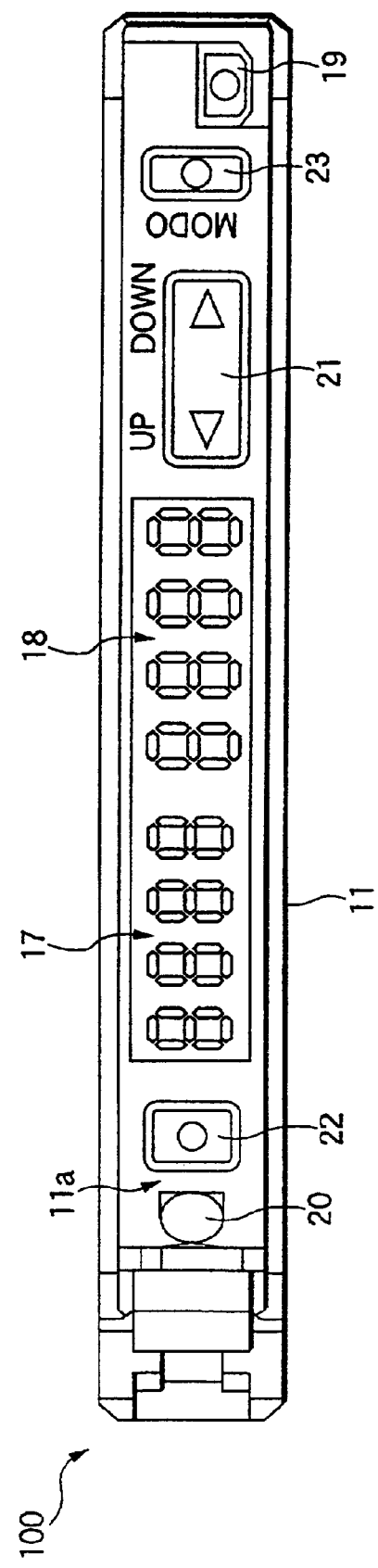
FIG. 2 is a plan view of the photoelectric switch in FIG. 1 according to the first embodiment of the present invention.

FIGS. 1 and 2 show a photoelectric switch of a first embodiment of the invention. As a described above, FIG. 1 is a perspective view of the photoelectric switch and FIG. 2 is a plan view of the photoelectric switch. The photoelectric switch 100 shown in the figures is a reflection-type photoelectric switch for emitting light to a detected object and receiving its reflected light. The photoelectric switch 100 is also an integral-type photoelectric switch comprising a light emission element and a light reception element placed on a main unit in which also include an amplifier, a CPU, and the like.

The photoelectric switch 100 has a narrow and comparatively elongated box-like casing 11. The casing 11 contains a light emission element 12 and a light reception element 13, and optical fibers 14 and 15 facing both of the elements 12 and 13 (see FIG. 3). The optical fibers 14 and 15 extend to the outside from one end face of the casing 11. Power supply to and output from the photoelectric switch 100 are performed through a cable 16 (see FIG. 1). The cable 16 extends from the other end face of the casing 11.

The casing 11 has a comparatively elongated and roughly rectangular top face 11a. As best shown in FIG. 2, first and second display sections 17 and 18 are placed adjacent in a side by side fashion in the lengthwise direction of the top face 11a of the casing 11 on at the same plane of the top face 11a. Each of the first and second display sections 17 and 18 has four subsections placed adjacent in a side by side fashion in the lengthwise direction of the top face 11a of the casing 11. Each subsection is implemented as a seven-segment LED. That is, each of the first and second display sections 17 and 18 can display four numbers or alphanumeric characters side by side. Therefore, for example, when a numeric value is displayed on the first or second display section 17 or 18, a four-digit numeric value can be displayed. The seven-segment LED may be implemented as single-color LED or two-color LED. The first or second display sections 17 or 18 may be implemented as a monochrome or color liquid crystal display (LCD).

The casing 11 has on the top face 11a, an output logic switch 19, an output on/off indicator 20, a swing-type threshold value adjustment switch (or up/down key) 21, a threshold value set switch (or key) 22, and a display mode switch key 23 (simply called the M key). A one-way draw lid 24 (see FIG. 1) is attached to the other end of the top face 11a of the casing 11 via a pivot connection. The lid 24 can cover the top face 11a.

Placement of the three switches or keys on the casing 11 will be discussed in detail. The threshold value set key 22 is placed at one end part of the casing 11 in the lengthwise direction thereof. On the other hand, the up/down key 21 and the M key 23 are placed at the other end part of the casing 11 in the lengthwise direction thereof. That is, relative to the two display sections 17 and 18 placed adjacent to one another in a side by side fashion, the threshold value set key 22 is placed on one side (left of the first display section 17), and the up/down key 21 and the M key 23 are placed on the other side (right of the second display section 18). The up/down key 21 is placed adjacent to the second display section 18 on the right. The M key 23 is placed at the right end of the casing away from the second display section 18.

Thus, the two left and right display sections 17 and 18 are placed adjacent to one another in a side by side fashion, so that two information pieces such as the threshold value, the light reception amount, etc., can be displayed side by side as described later. Thus the user can read the two information pieces without moving his or her gaze. On the narrow top face 11a of the casing 11 of the embodiment, the threshold value set switch (or key) 22 is placed on one side and the threshold value adjustment switch (up/down key) 21 is placed on the other side with the first and second display sections 17 and 18 placed side by side therebetween. Therefore, the part for setting the threshold value (the left part of the first display section 17 where the threshold value set key 22 is placed) and the part for adjusting the threshold value (the right part of the second display section 18 where the up/down key 21 is placed) are spaced a large distance from each other. Thus, there is no fear of pressing the wrong key or switch by mistake such as when one key or switch is pressed in the case where the keys or switches 21 and 22 are placed adjacent to each other.

Likewise, the threshold value set key 22 and the mode change switch (or M key) 23 involved in two different operation determinations are placed a large distance from each other with the display sections 17 and 18 therebetween. Thus there is no fear of erroneously operating the keys or switches 22 and 23.

The output on/off indicator 20 is turned on or off when indicating an output state of detecting the presence or absence of a detected object from the relationship between the light reception amount and the threshold value. The logic (turning on or off when the output is on) of the relationship between turning on or off the output on/off indicator 20 and the output state can be changed by operating the output logic switch 19. The up/down key 21 is used to finely adjust the threshold of value as is described later. One side or the other side of the swing-type up/down key 21 is selectively pressed, whereby the threshold of value can be adjusted.

The threshold value set key 22 is used to automatically set a threshold value. That is, if the threshold value set key 22 is pressed with a detected object T (see FIG. 3) placed in a detection area and then is again pressed with the detected object T removed from the detection area, the value between the light reception amount when the detected object T exists and that when the detected object T is removed is automatically set as a threshold value. The setup threshold value is displayed on the first display section 17 or the second display section 18, as described later in more detail. The M key 23 is used to switch display information of the first and second display sections 17 and 18 and change the displayed items in the switched display information, as described later in more detail.

Figure 3:
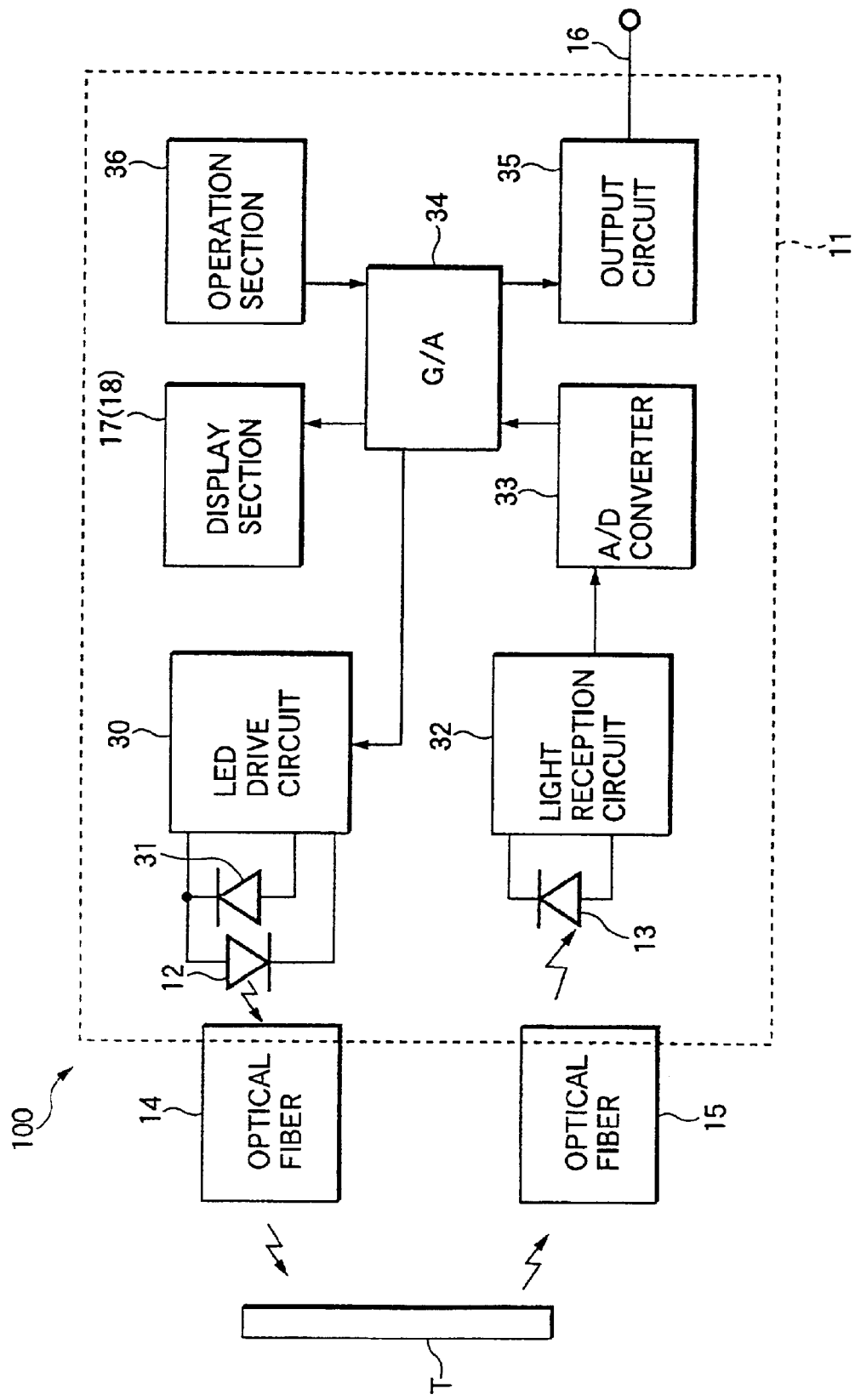
FIG. 3 is a block diagram of the photoelectric switch in FIG. 1 according to the first embodiment of the present invention.

FIG. 3 is a block diagram to show a whole outline of the photoelectric switch 100. The photoelectric switch 100 has a drive circuit 30, a photodiode 31 for monitoring, a light reception circuit 32, an A/D converter 33, a gate array or control circuit 34, and an output circuit 35. The drive circuit 30 causes the light emission element 12 made of a photodiode, etc., for example, to emit light. The light reception circuit 32 is connected to the light reception element 13 made of a photodiode, etc. The A/D converter 33 converses an output signal from the light reception circuit 32 from an analog form into a digital form. The gate array or control circuit 34 controls the first and second display sections 17 and 18. The output circuit sends a signal from the control circuit 34 to the outside. Signals from an operation section 36 containing the switches 21 to 23 such as the threshold value adjustment switch and the display mode change switch previously described are input to the control circuit 34.

As already known, the photoelectric switch 100 compares the amount of light received by the light reception element 13 with a threshold value. Then the photoelectric switch 100 detects the presence of absence of the detected object T depending on the larger-than or less-than relationship therebetween, and outputs the result. For example, the current amount of light received by the light reception element 13 and the threshold value set to detect the presence or absence of the detected object T are displayed on the first and second display sections 17 and 18 described above. Whether the current light reception amount is to be displayed on the first display section 17 (left) or the second display section 18 (right) is arbitrary. That is, the current light reception amount is displayed on either the left and right display sections 17 and 18 and the threshold value is displayed on the other one. In the embodiment, the threshold value is displayed on the first display section 17 (left) and the current light reception amount is displayed on the second display section 18 (right).

Information displayed on the display made up of the first and second display sections 17 and 18 is roughly classified into the following categories:

(A) Light reception amount and/or threshold value
(B) Operation state check
(C) Various setup items and parameters, namely, operation function settings
(D) Display
(A) Display Items Concerning "Light Reception Amount and/or Threshold Value"
(1) Numeric display of current light reception amount
(2) Numeric display of threshold value
(3) Percent (%) display of tolerance The tolerance refers to a relative value of the current light reception amount to the threshold value and can be represented by the following expression:

Tolerance=(light reception amount)/(threshold value)

(4) Bar form display of tolerance
(5) Numeric display of maximum and minimum light reception amounts within a predetermined time
(6) Percent (%) display of maximum and minimum light reception amounts within a predetermined time
(B) Display Items Concerning "Operation State Check"
(1) Operation Mode Check The operation mode concerns the operation or capability that can be set with the photoelectric switch 100 of the embodiment, and one of the operation modes can be set depending upon the optimum detection distance, etc. The operation mode will be discussed later in detail.
(2) Timer Mode Check The timer mode will be discussed later.
(C) Display Items Concerning "Operation Function Setting"
(1) Operation Mode Switch The photoelectric switch 100 can be used with a capability adapted for the detection environment as one of the operation modes is selected for use, as described later in detail.
(2) Timer Mode On/Off Switch and Timer Value Setting When the timer mode is set to OFF, if the photoelectric switch 100 detects the presence of a detected object T, it immediately outputs a detection signal and continues to output the detection signal while the photoelectric switch 100 detects the presence of the detected object T. In contrast, when the timer mode is set to ON, an ON signal is output after the expiration of a setup delay time after detecting the presence of the detected object T or an OFF signal is output after the expiration of the setup delay time after the detected object T disappeared. The delay time (timer value) can also be set arbitrarily.

The timer mode on/off switch contains a one-shot control. The one-shot control is as follows: For example, when a detected object T is detected, an ON signal is output for a given time from the rising edge of the ON signal. This signal is generated only once in response to the detection which is independent of the time period during which the detected object T is detected. Specifically, when the detected object T is a minute substance and the actual detection time is short, if the ON signal is to be set to a time longer than the detection time, the one-shot control is used. In contrast, when the actual detection time is long, if the ON signal is to be set to a shorter output time than the detection time, the one-shot control is used. The duration of the ON signal output can be set arbitrarily as the timer value.
(3) On/Off Switch for APC Function of Photoelectric Switch 100

The APC function is a function for maintaining the light emission amount of the light emission element 12 constant as is already known. If the APC function is turned on, it works; if the APC function is turned off, it is canceled.

(4) Differential Mode Switch

If the differential mode is turned on, the differential waveform of the light reception amount is output using digital processing. The differential mode is used to detect the rising or falling edge of a signal when the detected object T passes through.
(5) Display Mode Setting in "Threshold Value Display" Mode of Basic Display Information With the photoelectric switch 100, a partial display mode for displaying only some items concerning "threshold value display" (Std mode) or a full display mode for displaying all items (Full mode) can be selected.
(D) Display Items Concerning "Display"
(1) Eco Mode Switch The eco mode can be set to two levels. The first level is called Half mode and it includes a numeric value. This mode changes simply to a display form like a small red or green lamp, for example. When some key is pressed, the display form is restored to the normal display, namely, an alphanumeric display. The second level is called the All mode. In this mode when a key is pressed after the numeric value is completely turned off, the display form is restored to the normal display.
(2) Display Value Shift Switch When displaying the light reception amount, the numeric value is shifted. If the display value shift switch is turned off, the numeric value corresponding to the actual light reception amount is displayed; if the display value shift switch is turned on, a numeric value larger or smaller than the actual numeric value is displayed. The numerical value can be any desired numeric value set by the user. For example, when four photoelectric switches are placed side by side, if different light reception amounts are displayed on the photoelectric switches, the display value shift switch is used to visually unify the displayed numeric values.

The enumerated display items are simply described by way of example and if the photoelectric switch is made increasingly multifunctional, another item may be added as the information to be accordingly displayed and the display item will also be changed in response to any additional functions for which the photoelectric switch was designed.

The information display on the first and second display sections 17 and 18 of the photoelectric switch 100 is outlined as follows:

(1) The information display is roughly classified into a first information group and a second information group. The first information group displayed as the basic display information comprises (A) items concerning "light reception amount and/or threshold value" and (B) items concerning "operation state check." The second information group as the second display information comprises (C) items concerning "various setup items and parameters" and (D) items concerning "display."

More preferably, the information display may be roughly classified into three groups or may be roughly classified into the four groups of (A) to (D) described above. The items enumerated in (A) to (D) may also be classified from another viewpoint.

(2) Considering the user's use frequency, necessity, etc., in the first information group forming the basic display information, the user can alternately select a partial display mode (Std mode) for displaying only items that have a particularly high frequency of use and necessity or a full display mode (Full mode) for displaying all items.

(3) The second display information concerns "operation function setting" and "display" in the second information group. The user can alternately select a partial display mode (Easy mode) for only displaying items concerning the basic setting of the photoelectric switch 100 or only items having a high frequency of use and necessity from among the items contained in the second information group or a full display mode (Pro mode) for displaying all items. Of course, the items may also be classified into those concerning operation function setting and those concerning display. A first mode for displaying some of the items concerning the operation function setting, a second mode for displaying all items concerning the operation function setting, and a third mode for displaying the items concerning display may be provided so that the user can select any of the first to third modes in response to their purpose. Such a classification may be made depending on whether each item is a setup item required in the normal use state or a setup item required in a special use state.

As for the operation concerning the display on the first and second display sections 17 and 18 of the photoelectric switch 100, when the display mode switch key (M key) 23 is continuously pressed for three seconds or more, for example, which will be hereinafter referred to as "long press," a transition is made from the display of basic display information so as to display the items in the first group ("light reception amount and/or threshold value display" mode) to the display of the second display information so as to display the items in the second group ("operation function setting" mode). That is, a transition is made from displaying the basic display information in the first group to displaying the second display information in the second group provided that the M key 23 has experienced a long press. Of course, a separate key or button dedicated to switching the display group may be provided or the display group switch function may be added to another switch contained in the photoelectric switch 100. A transition may also be made from the basic display information to the second display information by pressing two keys or switches at the same time. If the information display is roughly classified into three or more groups as described above, for example, a transition may be made from the information display for the first group to the information display for the second group and from the information display for the second group to the information display for the third group by depressing the M key 23 for a long press.

As for the "light reception amount and/or threshold value display" mode of the basic display information, an item may be provided that allows a switch between the Std mode and the Full mode in the basic display information and this allows the user to select the Std mode or the Full mode in the basic display information.

As for the "operation function setting" mode of the second display information, switching between the Easy mode and the Pro mode may be executed in the process of making a transition from the basic display information to the second display information. Also, after completing the display of the items in the Easy mode substantially in the second display information, the user may select proceeding with the display items in the Pro mode or completing the display of the second display information and returning to the basic display information.

Several specific examples concerning the display with the photoelectric switch 100 will be discussed.

First Embodiment (FIGS. 4 to 15)

Figure 4:
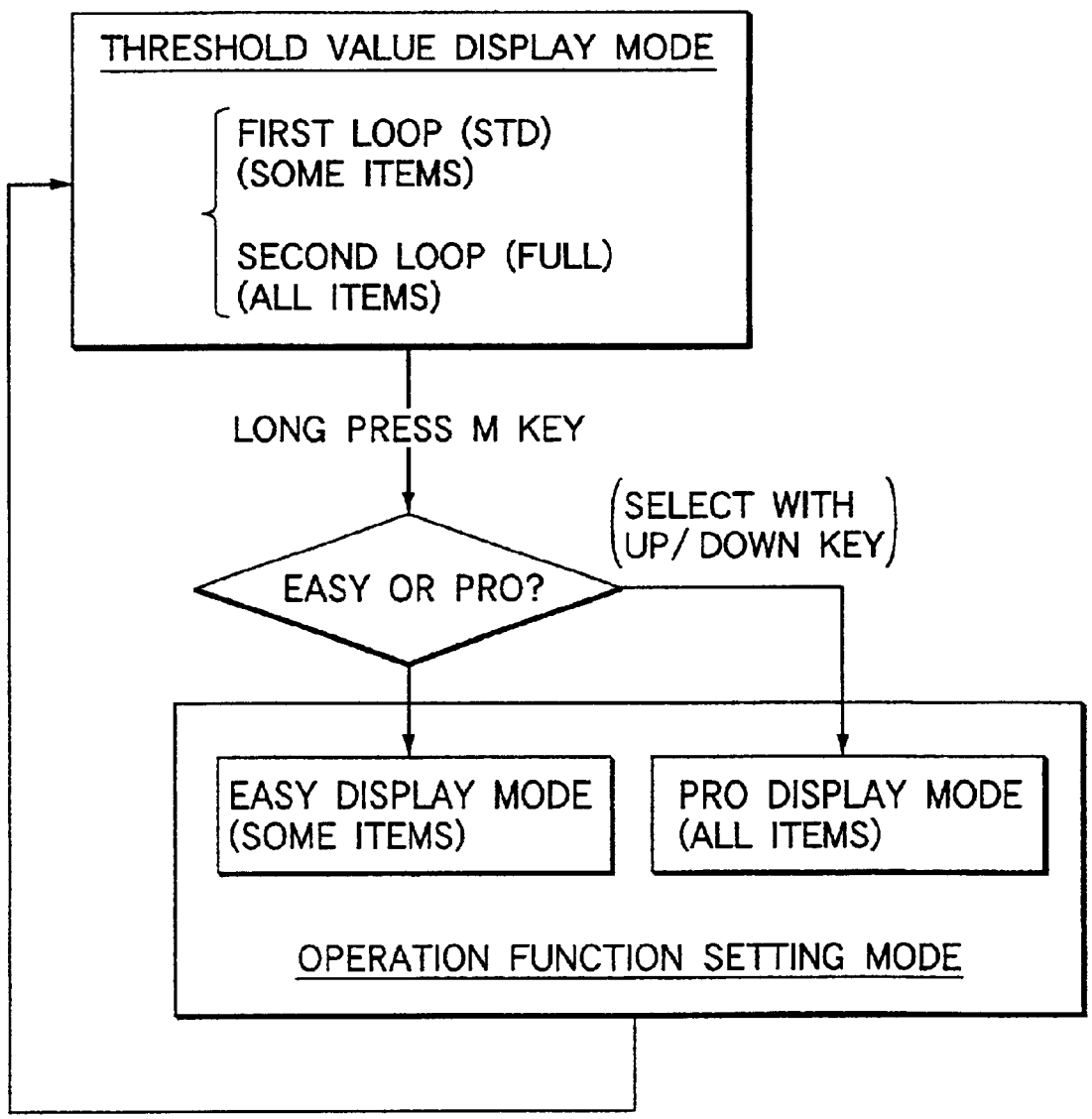
FIG. 4 is a schematic representation of an outline of a display method of the first embodiment of the present invention.

FIG. 4 shows an outline of a first embodiment concerning the display using the photoelectric switch 100. A transition can be made from the "light reception amount and/or threshold value display" mode of the basic display information that displays the items in the first group to the "operation function setting" mode of the second display information that displays the items in the second group by a long press of the M key 23. In the process, a selection menu for the user to select either Easy or Pro is displayed and then the user selects and sets either Easy or Pro on the selection menu, whereby the display mode for the second display information is set. The menu switch can be executed by operating the up/down key 21 to select Easy or Pro and subsequently the M key 23 is pressed for a comparatively short time, whereby the selected mode is set and a transition is made to the "operation function setting" mode of the second display information. The display of the second display information is executed in the selected Easy or Pro mode.

Figure 5:
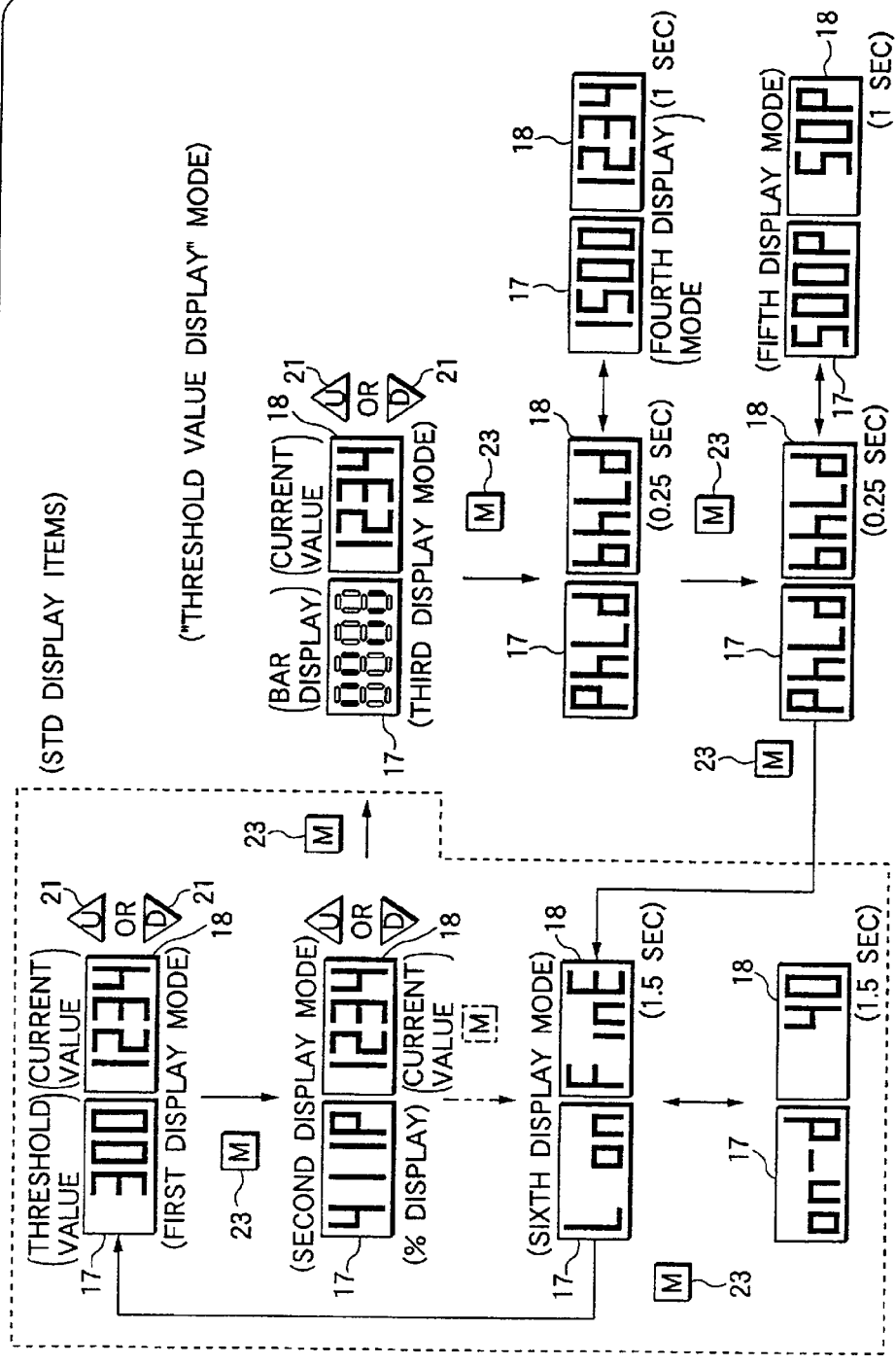
FIG. 5 is a drawing which shows the display form of the in basic display information in the first embodiment and the flow of the display items on the basic information display.

"Light Reception Amount and/or Threshold Value Display" Mode (Basic Display Information) for the First Group (FIG. 5)

The display of the basic display information contains the items of (A) "light reception amount and/or threshold value" and (B) "Operation State Check."

FIG. 5 shows a flow of the basic display information ("light reception amount and/or threshold value display" mode) in the Full mode. The first display mode of the "light reception amount and/or threshold value display" mode ("threshold value (numeric value)" & "current light reception amount (numeric value)") which initially is displayed is switched to the second to fifth display modes concerning the threshold value in order by pressing the M key 23 for a comparatively short time. The fifth display mode is changed to the sixth display mode for showing the current setup state of the operation mode, by further pressing the M key 23 for a comparatively short time. Then the sixth display mode is returned to the first display mode by pressing the M key 23 again for a comparatively short time. That is, in the "light reception amount and/or threshold value display" mode of the basic display information, a full display loop or cycle of switching from the first display mode to the second to sixth display modes in order and then returning to the first display mode is formed by repetitively pressing the M key 23.

The flow of the basic display information in the Std mode is indicated by the dashed line in FIG. 5. As seen in FIG. 5, in the Std mode, if the M key 23 is pressed for a comparatively short time, the first display mode that is initially displayed is switched to the second display mode and next the second display mode is switched to the sixth display mode. If the M key 23 is further pressed for a comparatively short time, the sixth display mode is returned to the first display mode. That is, in the Std mode, a partial-display loop or cycle of switching from the first display mode to the second display mode by pressing the M key 23, and making a transition to the sixth display mode by bypassing the third to fifth display modes based on additional pressing of the M key 23, and returning from the sixth display mode to the first display mode is formed.

First Display Mode

In the first display mode, the threshold value is numerically displayed in the first display section 17 and the current light reception amount (current value) is numerically displayed in the second display section 18.

Second Display Mode

In the second display mode, the tolerance value is numerically displayed in the first display section 17 and the current light reception amount is numerically displayed in the second display section 18. The tolerance value refers to a relative value of the current light reception amount to the threshold value, as previously described.

To clearly point out that the numeric value (tolerance value) in the first display section 17 is displayed as a percentage, the numeric value is followed by the letter P (meaning percentage) in the first display section 17 of the second display mode.

Third Display Mode

In the third display mode, the tolerance value is displayed in a bar form in the first display section 17 and the current light reception amount is numerically displayed in the second display section 18. To display the tolerance value in a bar form in the first display section 17, four seven-segment elements 71 to 74 are grouped to the left and right, four longitudinal segments 71a, 71b, 72a, and 72b at lower positions (or upper positions) of the right two seven-segment elements 71 and 72 are used and four longitudinal segments 73a, 73b, 74a, and 74b at upper positions (or lower positions) of the left two seven-segment elements 73 and 74 are used, as shown in FIG. 6.

Figure 6:
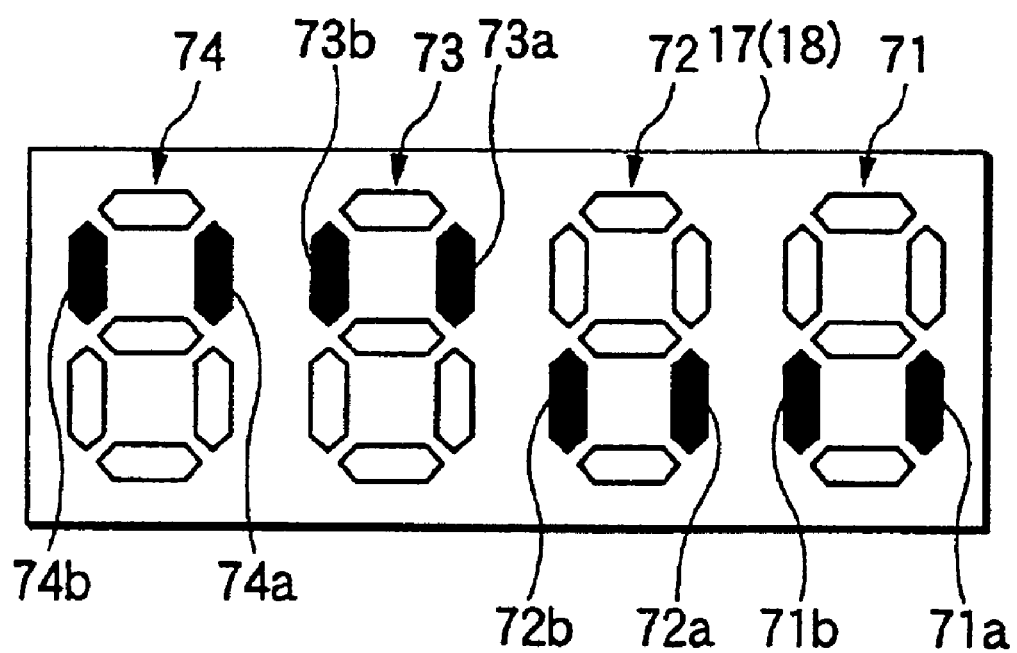
FIG. 6 is a drawing showing an example of how to display the tolerance in a bar form with four-digit display comprising four seven-segment elements placed side by side.

To use the bar display form in FIG. 6, the magnitude of the tolerance value can be known, for example, by emitting light from the longitudinal segments at the left positions in order with an increasing tolerance value starting at the right longitudinal segment 71a. From the fact that the two intermediate seven-segment elements 72 and 73, namely, the longitudinal segment 72b at the left of the right seven-segment element 72 and the longitudinal segment 73a at the right of the left seven-segment element 73, are spaced apart up and down, the user recognizes that the threshold value exists therebetween. That is, the longitudinal segments at the lower parts of the right two seven-segment elements 71 and 72 and the longitudinal segments at the upper parts of the left two seven-segment elements 73 and 74 are used, whereby a difference in the vertical level (the difference between the up and down positions) appears in the bars indicating the tolerance value extending from the right to the left and can inform the user that the difference in the levels is the threshold value level.

For example, if the level of one longitudinal segment is set to 5%, the eight upper longitudinal segments and the eight lower longitudinal segments contained in the four seven-segment elements 71 to 74 (four-digit display) are placed side by side and thus if the threshold level is set between the fourth longitudinal segment 72b from the right and the fifth longitudinal segment 73a from the right, the tolerance value can be shown in the range of approximately ±20% with the threshold level between.

The tolerance value may be displayed in bar form so that it increases from left to right. The segment elements are not limited to the four seven-segment elements 71 to 74 and may be, for example, five five-segment elements (five-digit display). The bar display may also be produced using the longitudinal segments at the lower positions of the left seven-segment elements 73 and 74 and the longitudinal segments at the upper positions of the right seven-segment elements 71 and 72.

Fourth Display Mode

On the fourth display mode, the maximum value and the minimum value of light reception amounts within a given time period are displayed in the first display section 17 and the second display section 18, respectively. On the fourth display mode shown in FIG. 5, "PhLd" in the first display section 17 on the left is short for Peak Hold, namely, this means the maximum value and "bhLd" in the second display section 18 on the right is short for Bottom Hold, namely, this means the minimum value.

On the fourth display mode, first the character strings "PhLd" and "bhLd" are displayed only for about 0.25 seconds in the first and second display sections 17 and 18 and then the displays are automatically switched. Then the numeric value of the maximum value is displayed in the first display section 17 on the left and the numeric value of the minimum value is displayed in the second display section 18 on the right. The numeric display is continued for one second and then automatically is returned to the character string display of "PhLd" and "bhLd." After this, the sequence is repeated.

Fifth Display Mode

In the fifth display mode, the numeric values of converting the maximum value and the minimum value into tolerance values are displayed in the first display section 17 and the second display section 18. The tolerance value of the maximum value is represented by the following expression:

$$\text{Tolerance of maximum value} = \text{maximum value}/\text{Threshold value}$$

The tolerance of the minimum value is represented by the following expression:

$$\text{Tolerance of minimum value} = \text{minimum value}/\text{Threshold value}$$

the tolerance value is displayed as a percentage on the fifth display mode. That is, that tolerance displayed on the first and second display section 17 and 1810 be represented by the following expression:

$$\text{Tolerance of maximum value } (\%) = (\text{maximum value}/\text{threshold value}) \times 100$$

$$\text{Tolerance of maximum value } (\%) = (\text{minimum value}/\text{threshold value}) \times 100$$

Also in the fifth display mode like the fourth display mode described above, first the character strings "PhLd" and "bhLd" are displayed only for about 0.25 seconds in the first and second display sections 17 and 18, and then the displays are automatically switched. The numeric value of the tolerance (%) of the maximum value is displayed in the first display section 17 and the numeric value of the tolerance (%) of the minimum value is displayed in the second display section 18. The numeric display is continued for one second and then it is automatically returned to the character string display of "PhLd" and "bhLd." After this, the sequence is repeated. To clearly point out that the numeric values of the tolerance concerning the maximum value and the minimum value in the first and second display sections 17 and 18 are displayed as a percentage, each numeric value indicating the tolerance is followed by the letter P meaning percentage in the numeric display of the fifth display mode.

The setup threshold value can be adjusted by pressing the UP or DOWN sides of the swing-type threshold value adjustment switch (or up/down key) 21 on every display mode of the first to fifth display modes described above. The threshold value when the operator stops pressing the up/down key 21 is set as a new threshold value. If the operator presses the up/down key 21 on any of the third to fifth display modes, the display mode is immediately and automatically switched to the second display mode and while the up/down key 21 is operated, the second display mode is maintained. When the operator stops pressing the up/down key 21, the second display mode is returned to the former display mode which was one of the third to fifth display modes.

Sixth Display Mode

In the sixth display mode, the current setup operation mode is displayed. In the sixth display mode shown in FIG. 5 to check the operation mode of the photoelectric switch 100, "Lon" in the first display section 17 on the left is short for Light-ON and this means that the photoelectric switch is turned ON when light is incident. The display character string "FinE" in the second display section 18 on the right indicates the current setup operation mode.

In the sixth display mode, the timer value is also displayed. In the sixth display mode shown in FIG. 5, "on-d" in the first display section 17 on the left means that the delay time until an ON signal is sent to an external machine after the photoelectric switch 100 senses light reception, is set. That is, it means that the delay time is set from when the photoelectric switch 100 detects light reception until an output signal is sent to an external machine. The delay time is numerically displayed in the second display section 18 on the right. How to set the timer mode will be described later in detail.

In the sixth display mode, the setup state of the operation mode is displayed for about 1.5 seconds and then whether or not the timer is set is indicated for about 1.5 seconds. The display then returns to the display indicating the setup state of the operation mode. Then, the sequence is repeated.

The first to sixth display modes described above are switched sequentially and the sixth display mode is returned to the first display mode, by pressing the M key 23 for a comparatively short time. Then, the sequence is repeated.

The circulatory display switch of the first to sixth display modes described above is applied when the "Full" mode is set. On the other hand, when the "Std" mode is set, a transition is made from the second display mode to the sixth display mode. In the Std mode, the transition to the third to fifth display modes is canceled.

Figure 7:
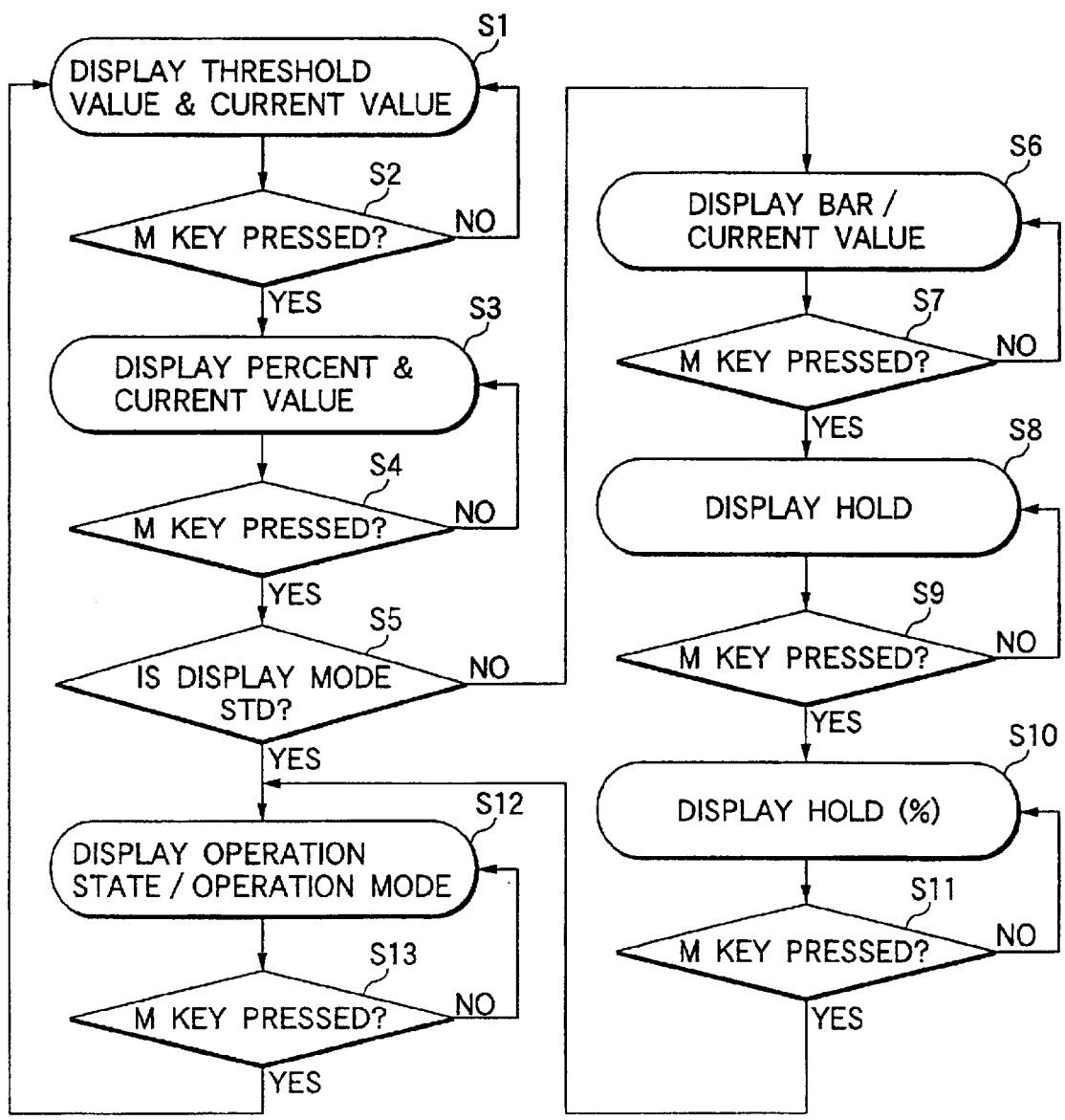
FIG. 7 is a flowchart showing a full display mode (Full mode) on the basic information display of the first embodiment.

FIG. 7 shows a flowchart concerning the display item switch in the "light reception amount and/or threshold value display" mode. Now, assuming that the display mode of the first and second display sections 17 and 18 is the first display mode (threshold value and current light reception amount) (step S1), if the M key 23 is pressed for a comparatively short time, a transition is made from step S2 to step S3 and the first display mode is switched to the second display mode (% display of tolerance and current light reception amount). Further, if the M key 23 is pressed on the second display mode, a transition is made from step S4 to step S5. There it is determined whether or not the "Std" mode concerning the light reception amount and/or threshold value display has been. If the "Std" mode is set (YES), steps S6 to S11 are skipped and the control goes to step S12 (display of the operation state/operation mode). On the other hand, if the "Full" mode is set at step S5 (NO), control goes to step S6 and a bar display of the tolerance value, etc., is executed.

If the M key 23 is long pressed on any of the first to sixth display modes, the display mode is switched to the selection menu for selecting "Easy" or "Pro" previously described with reference to FIG. 4.

Figure 8:
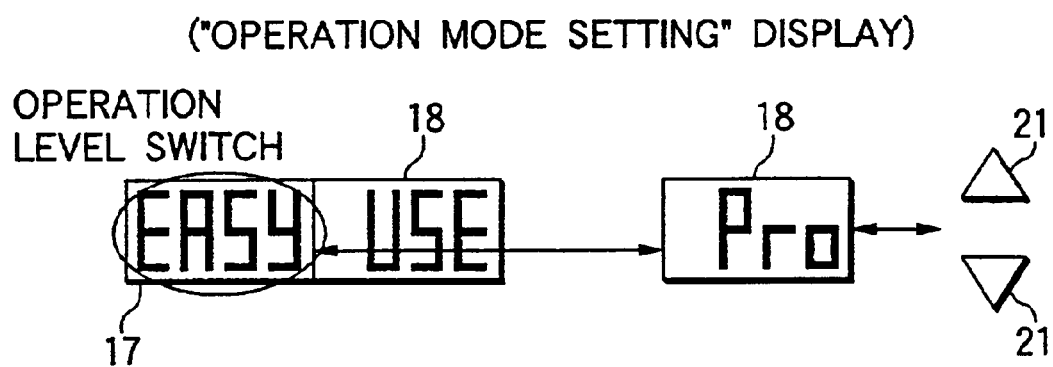
FIG. 8 is a drawing showing a mode selection in a second information display.
Figure 9:
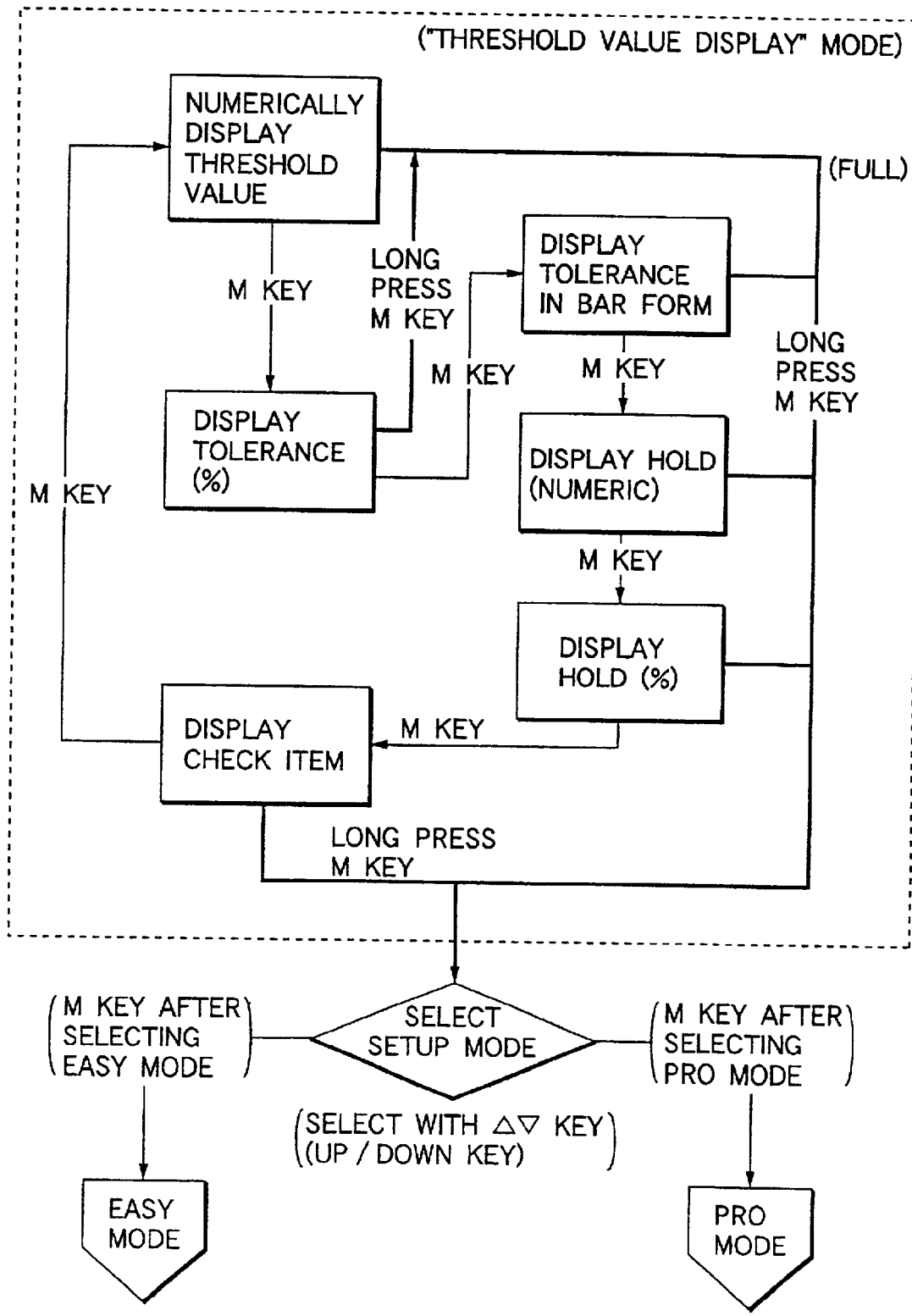
FIG. 9 is a flowchart showing the flow from a full display mode ("Full" mode) to the mode selection in the second information display.
Figure 10:
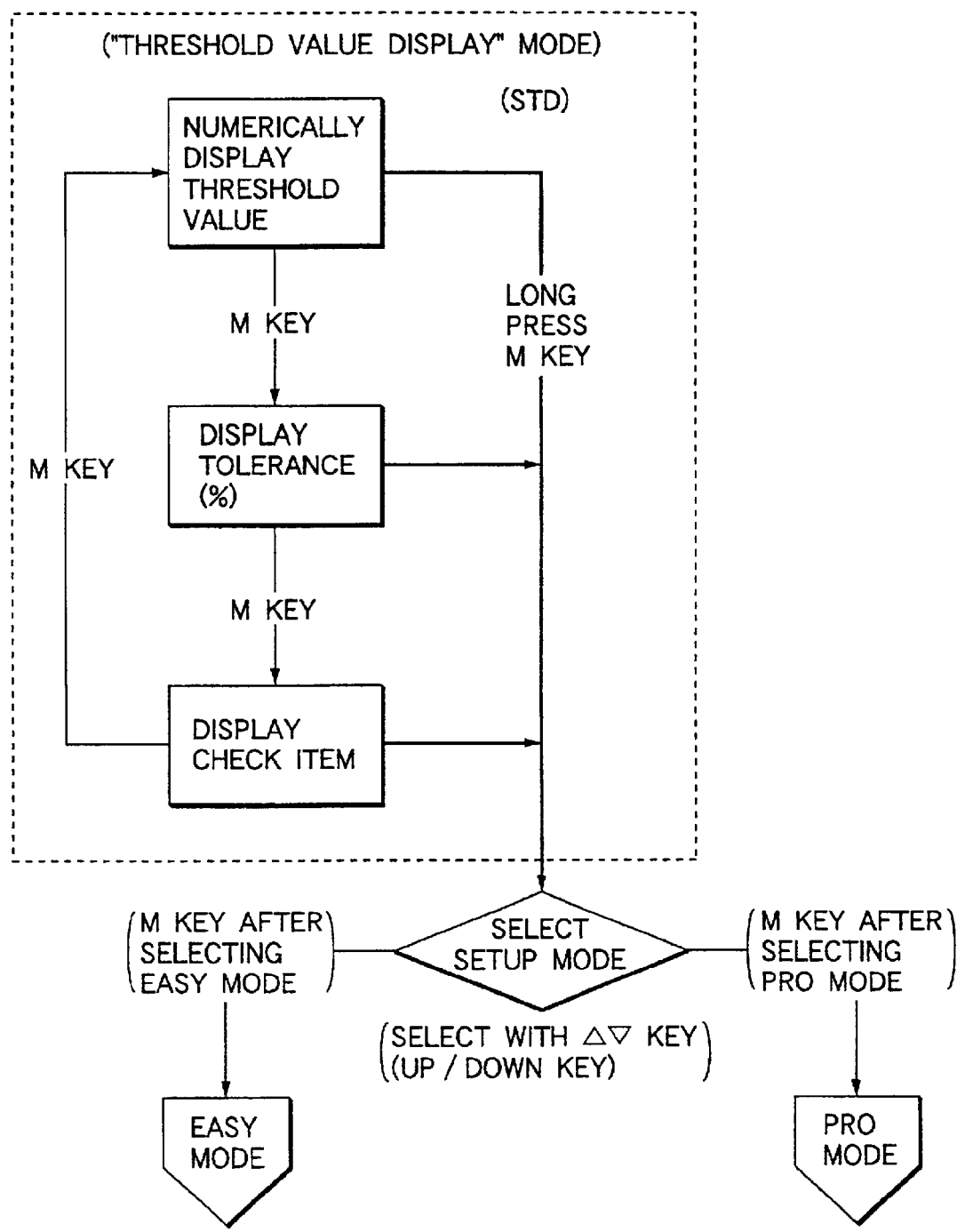
FIG. 10 is a flowchart showing the flow from a partial display mode ("Std" mode) to the mode selection in the second information display.

FIG. 8 shows a selection menu for the user to select the "Easy" mode or the "Pro" mode to execute the "operation function setting" mode (FIG. 4). FIGS. 9 and 10 show outlines of operational flows concerning selection of "Easy" or "Pro." FIG. 9 is a drawing concerning the "Full" mode and FIG. 10 is a drawing concerning the "Std" mode. As seen in FIGS. 9 and 10, in the "light reception amount and/or threshold value display" mode, the M key 23 can be long pressed for completing the "light reception amount and/or threshold value display" mode and entering the selection step of the operation mode of the photoelectric switch 100 (FIG. 8) regardless of which of the first to sixth display modes is displayed.

Figure 11:
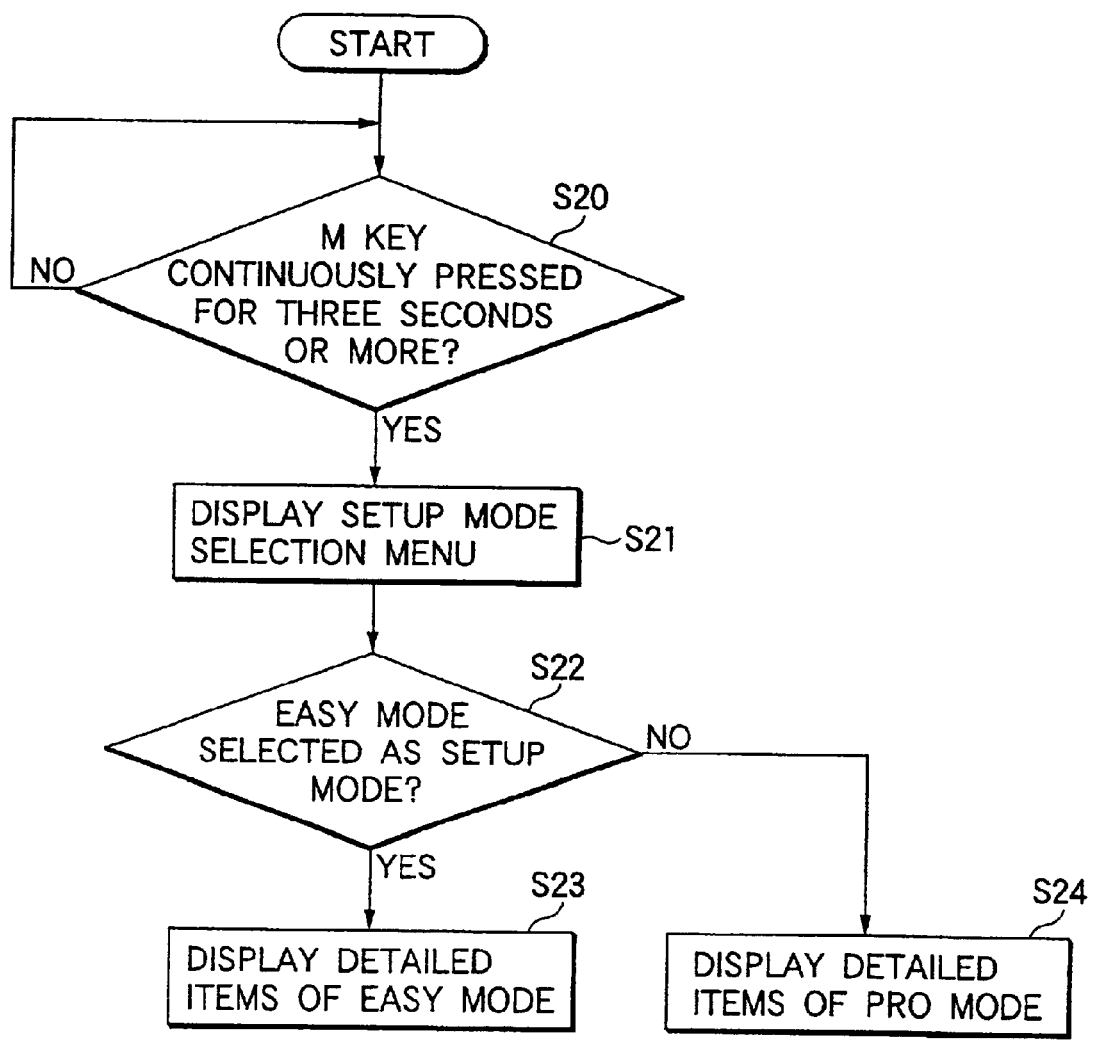
FIG. 11 is a flowchart showing the flow from the basic information display to the mode selection in the second information display.

FIG. 11 is a detailed flowchart concerning selection of "Easy" or "Pro." Referring to FIG. 11, if the M key 23 is long pressed in any display mode on the first to sixth display modes of the basic display information (see FIG. 5) (step S20), the "light reception amount and/or threshold value display" mode of the basic display information is exited and the selection step of the operation mode of the photoelectric switch 100 is entered and the character string "Easy" is displayed in the first display section 17 on the left (step S21, FIG. 8).

The display in the first display section 17 is changed to the character string "Pro" by pressing the up/down key 21 (see FIG. 8). As the user presses the M key 23 for a comparatively short time when the character string "Easy" is displayed in the first display section 17 (step S22), the "Easy" mode can be set, and the "operation function setting" mode of the second display information is entered (step S23). In the "Easy" mode, the items are displayed according to a flow shown in FIG. 12.

In contrast, as the user presses the M key 23 for a comparatively short time when the character string "Pro" is displayed in the first display section 17 (step S22), the "Pro" mode can be set, and the "operation function setting" mode is entered (step S24). In the "Pro" mode, the items are displayed according to a flow shown in FIG. 15.

Figure 15:
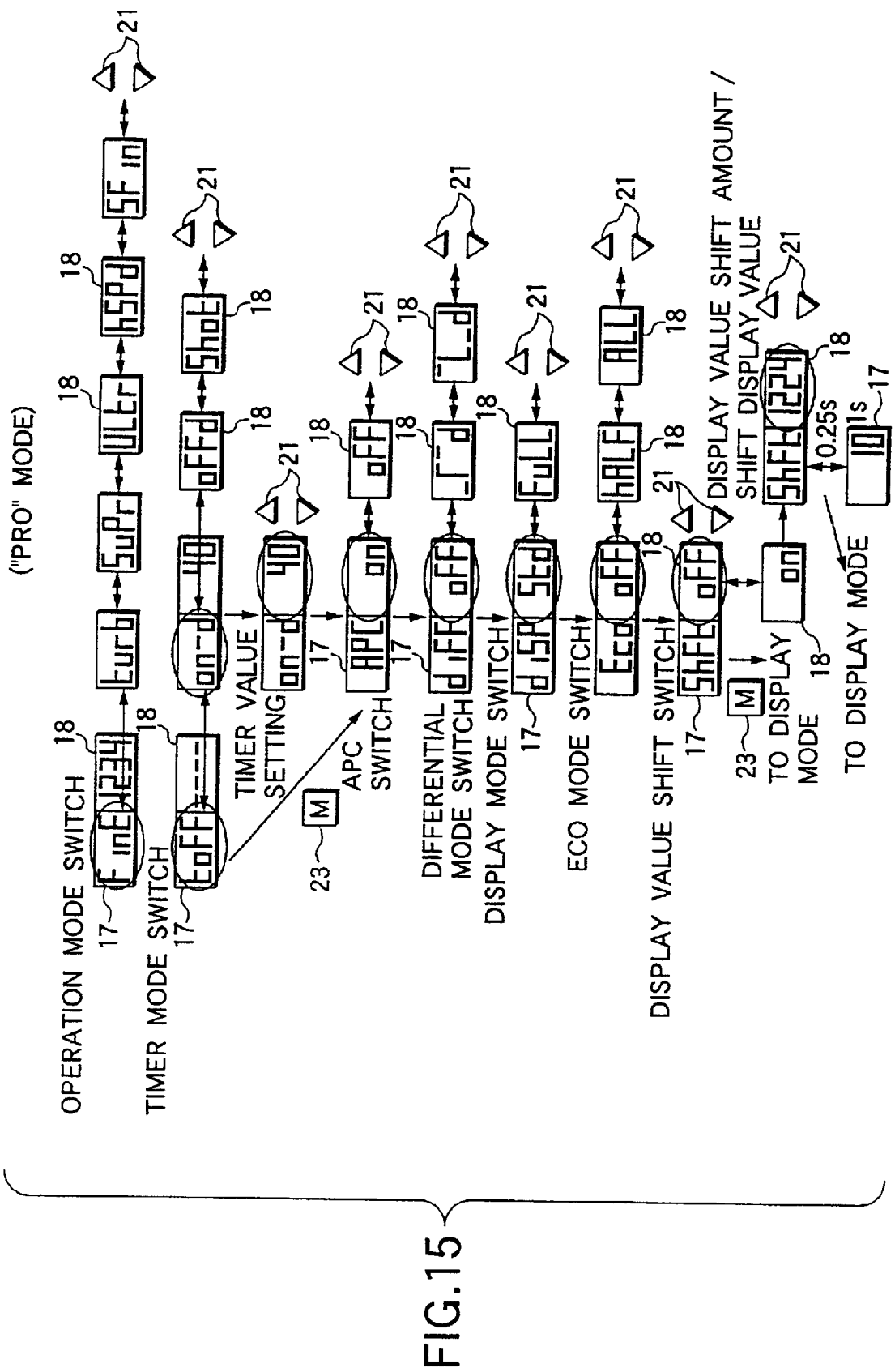
FIG. 15 is a drawing showing the display form of the second information display in a "Pro" mode and the flow of display items in the second information display.

"Operation Function Setting" Mode (Pro) (FIG. 15)

FIG. 15 shows the display items and the flow in the "Pro" mode for displaying all items concerning the functions of the photoelectric switch 100.

As the M key 23 is pressed for a comparatively short time, the display is switched in the following order:
(1) Operation mode switch;
(2) timer mode switch and timer value setting;
(3) APC function ON/OFF switch;
(4) differential mode switch
(5) display mode switch in "light reception amount and/or threshold value display" mode ("Std" or "Pro");
(6) economy mode switch
(7) display value shift switch and shift amount setting
Types of operation mode The photoelectric switch 100 of a preferred embodiment has a fine mode as the basic mode of operation and five additional operation modes including a turbo mode, a super turbo mode, an ultra-turbo mode, a high speed mode, and a super fine mode.
(1) Fine Mode The fine mode is the basic operation mode of the photoelectric switch 100. In the fine mode, the light emission amount of the photoelectric switch is set so that the photoelectric switch demonstrates the optimum capability when the detection distance, namely, the distance from the light emission element 12 to the detected object T is approximately 100 mm, for example, when one fiber sensor head is mounted.

The fine mode is suitable to detect, for example, the presence or absence of an impression on a bearing. Slight light amount changes caused by the presence or absence of a minute impression can be determined precisely.
(2) Turbo Mode In the turbo mode, a substantially larger light reception amount than that in the basic operation mode is set. The light emission amount is set so that the photoelectric switch demonstrates the optimum capability when the detection distance is 200 mm.

The turbo mode is suitable, for example, to detect a seal on a pasteboard.
(3) Super Turbo Mode In the super turbo mode, a more substantially larger light reception amount than that in the turbo mode is set. The light emission amount is set so that the photoelectric switch demonstrates the optimum capability when the detection distance is approximately 300 mm, for example.

The super turbo mode is suitable, for example, to detect the presence or absence of the detected object T in a state in which the light emission element or the fiber for guiding light from the light emission element and/or the light reception element or the fiber for guiding light into the light reception element and the detected object T are apart from each other.

(4) Ultra-Turbo Mode

In the ultra-turbo mode, a more substantially larger light reception amount than that in the super turbo mode is set. The light emission amount is set so that the photoelectric switch demonstrates the optimum capability when the detection distance is approximately 400 mm, for example.

The ultra-turbo mode is suitable, for example, to detect the presence or absence of the detected object T at a distance further than that in the super turbo mode or to detect the detected object T in a hostile environment containing a lot of dust, dirt, etc.

(5) High Speed Mode

In the high speed mode, higher response speed than that in the basic operation mode is set. The high speed mode is suitable, for example, to detect the detected object T passing through at a comparatively high speed.

(6) Super Fine Mode

Unlike the basic operation mode, the super fine mode is a mode in which the light amount is not saturated if the spacing between emitted light and received light of the photoelectric switch is relatively close. The super fine mode is suitable, for example, to detect a minute object with a transmission-type photoelectric switch.

FIG. 15 shows an "operation mode switch" menu of the first display item in the "Pro" mode. As the up/down key 21 is operated by pushing the UP portion, the menu in the first display section 17 is changed in order to the right. As the up/down key 21 is operated by pushing the DOWN portion, the menu display in the first display section 17 is changed in order in an opposite direction (to the left).

The display "FinE" means the fine mode in the basic operation mode. The display "turb" means the turbo mode. The display "SuPr" means the super turbo mode. The display "ULtr" means the ultra-turbo mode. The display "hSPd" means the high speed mode. The display "SFin" means the super fine mode. When any desired operation mode is displayed, the user can press the M key 23 for a comparatively short time for setting the operation mode and can make a transition to the second "timer" mode switch display item. The setup operation mode is displayed on the sixth display mode of the basic display information (FIG. 5).

Figure 12:
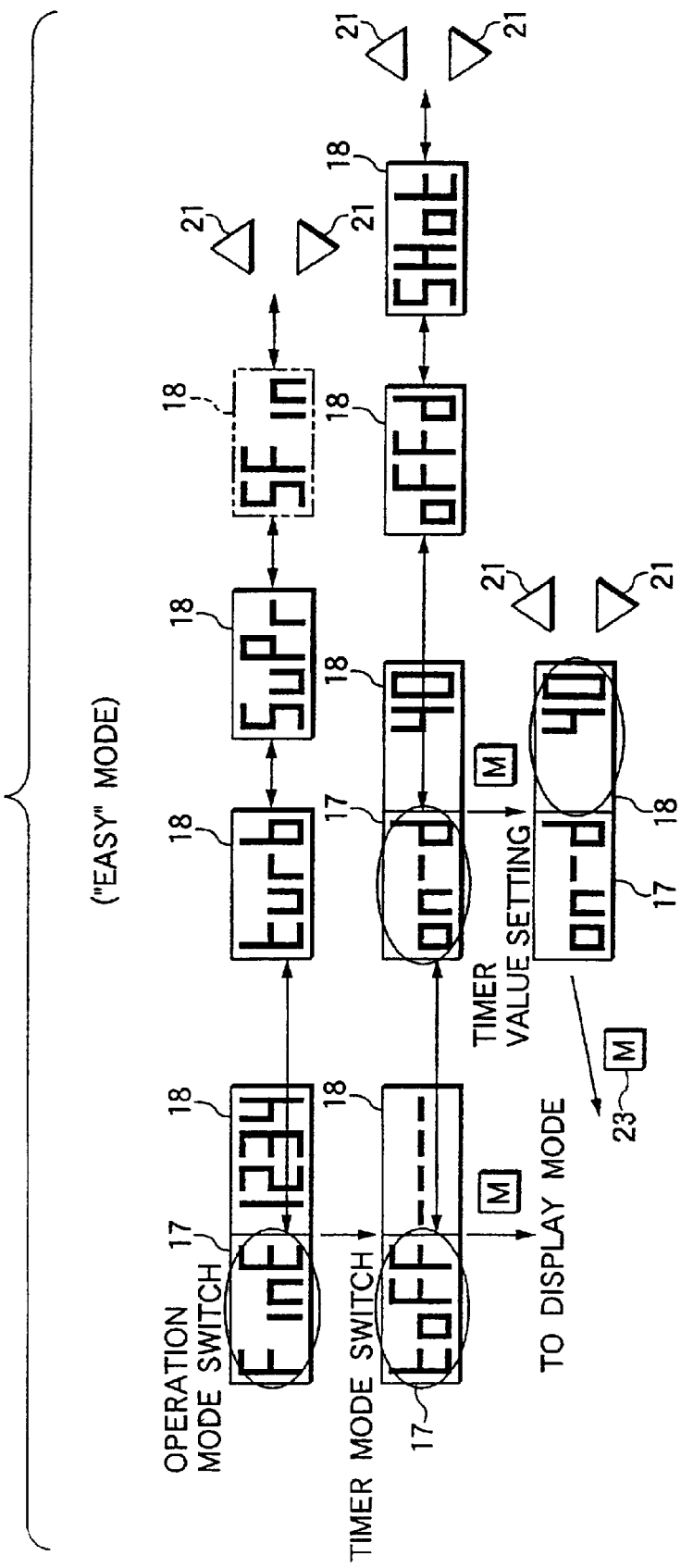
FIG. 12 is a drawing showing the display form of the second information display in an "Easy" mode and a flow of the display items in the second information display.

"Easy" Mode (FIG. 12)

FIG. 12 shows the display items in the "Easy" mode. In the "Easy" mode, the display is limited to (1) the various states of the operation mode switch and (2) the various states of the timer mode switch and timer value setting described above. These are the basic settings of the photoelectric switch 100. As the M key 23 is pressed, the "operation mode switch" display can be changed to the "timer mode switch" display. If the M key 23 is further pressed, the "timer mode switch" display is returned to the "light reception amount and/or threshold value display" mode of the basic display information. That is, if the M key 23 is pressed when the "timer mode switch" display is produced, the "operation function setting" mode is exited and the mode is returned to the "light reception amount and/or threshold value display" mode of the basic display information previously described.

In the "Easy" mode, the operation modes that can be selected by the user for the "operation mode switch" display, namely, selectable menu items are limited to the three operation modes of (1) fine mode (FinE), (2) turbo mode (turb), and (3) super turbo mode (SuPr). The user selects one from among the three operation modes by operating the up/down key 21 and then presses the M key 23, whereby any desired operation mode can be set.

In the "Easy" mode, the operation modes are limited to the three operation modes generally used. However, for example, if the mode is switched to the "Easy" mode after the super fine mode (SFin) not contained in the "Easy" mode is selected in the previous "Pro" mode, preferably "SFin" is added to the "operation mode switch" menu display and specially the current setup operation mode is also displayed in the "Easy" mode. In this case, most preferably the specially displayed "SFin" character string is set as the top display item of the "operation mode switch" display for making the user recognize the current setup super fine mode at the same time as the "operation mode switch" display is entered. If the user selects, for example, the super turbo mode (SuPr) that can be selected originally in the "Easy" mode out of the "operation mode switch" menu display, the super fine mode (SFin) may be deleted from the menu when the "Easy" mode is entered again.

If the current setup operation mode displayed is an operation mode that can be selected originally in the "Easy" mode, such as the super turbo mode (SuPr), the current setup operation mode is preferably displayed as the top display item. Accordingly, the user can see the display of the top display item to check the current setup operation mode. The same can be said of display items comprising a selection menu. That is, the current setup item is displayed as the top display item, namely, the current setup item is initially displayed, so that the user can see the current setup contents by viewing the top display item.

Figure 13:
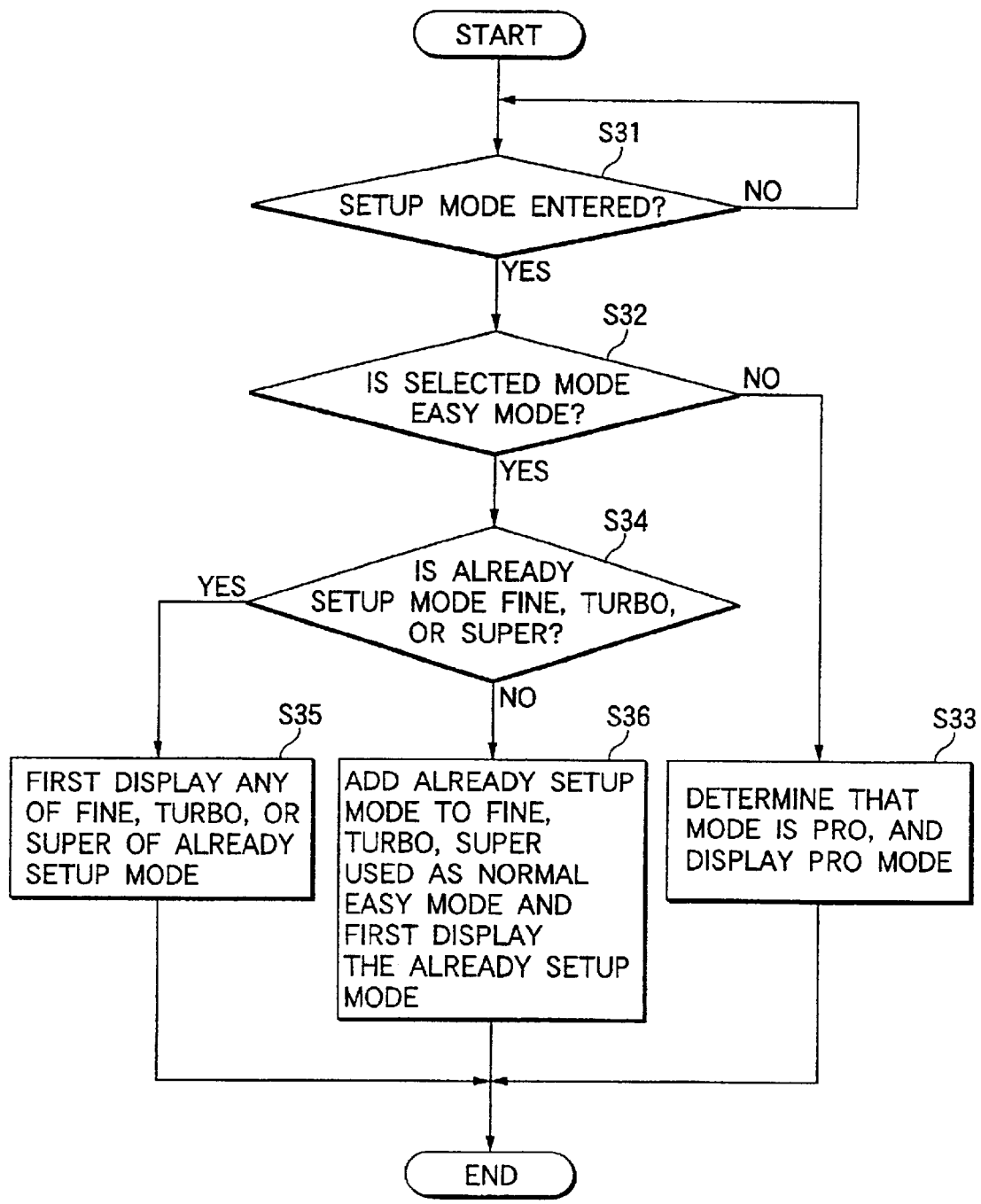
FIG. 13 is a flowchart showing the flow of the operation mode switch item in the "Easy" mode.

FIG. 13 is a flowchart concerning the "operation mode switch" display in the "Easy" mode. If long pressing the M key 23 (FIG. 9, FIG. 10) is detected in the "light reception amount and/or threshold value display" mode of the basic display information (step S31 in FIG. 13), the selection step of "Easy" or "Pro" (FIG. 8) is entered. If the user selects "Pro" by operating the up/down key 21 in the selection step and then presses the M key 23, control goes to step S33 from step S32 and the "operation function setting" mode of the second display information is executed as the "Pro" mode (FIG. 15).

On the other hand, if the user selects "Easy" by operating the up/down key 21 on the selection menu in FIG. 8 and then presses the M key 23, control goes to step S34 from step S32 and the current setup operation mode is determined.

The operation modes that can be set in the "Easy" mode are the three modes of the fine mode (FinE), the turbo mode (turb), and the super turbo mode (SuPr), as previously described.

When it is determined at step S34 that the current setup operation mode is any of the three operation modes that can be set in the "Easy" mode, control goes to step S35 and the "operation function setting" mode of the second display information is executed as the "Easy" mode and the current setup operation mode is displayed as the top display item of "operation mode switch", so the current setup operation mode is initially displayed.

When it is determined at step S34 that the current setup operation mode is none of the three operation modes that can be set in the "Easy" mode and it is the operation mode that can be set only in the "Pro" mode, control goes to step S36 and the "operation function setting" mode of the second display information is executed as the "Easy", mode. The character string meaning the current setup operation mode (for example, SFin) is then displayed as the top display item of "operation mode switch", so the current setup operation mode is initially displayed.

Figure 14:
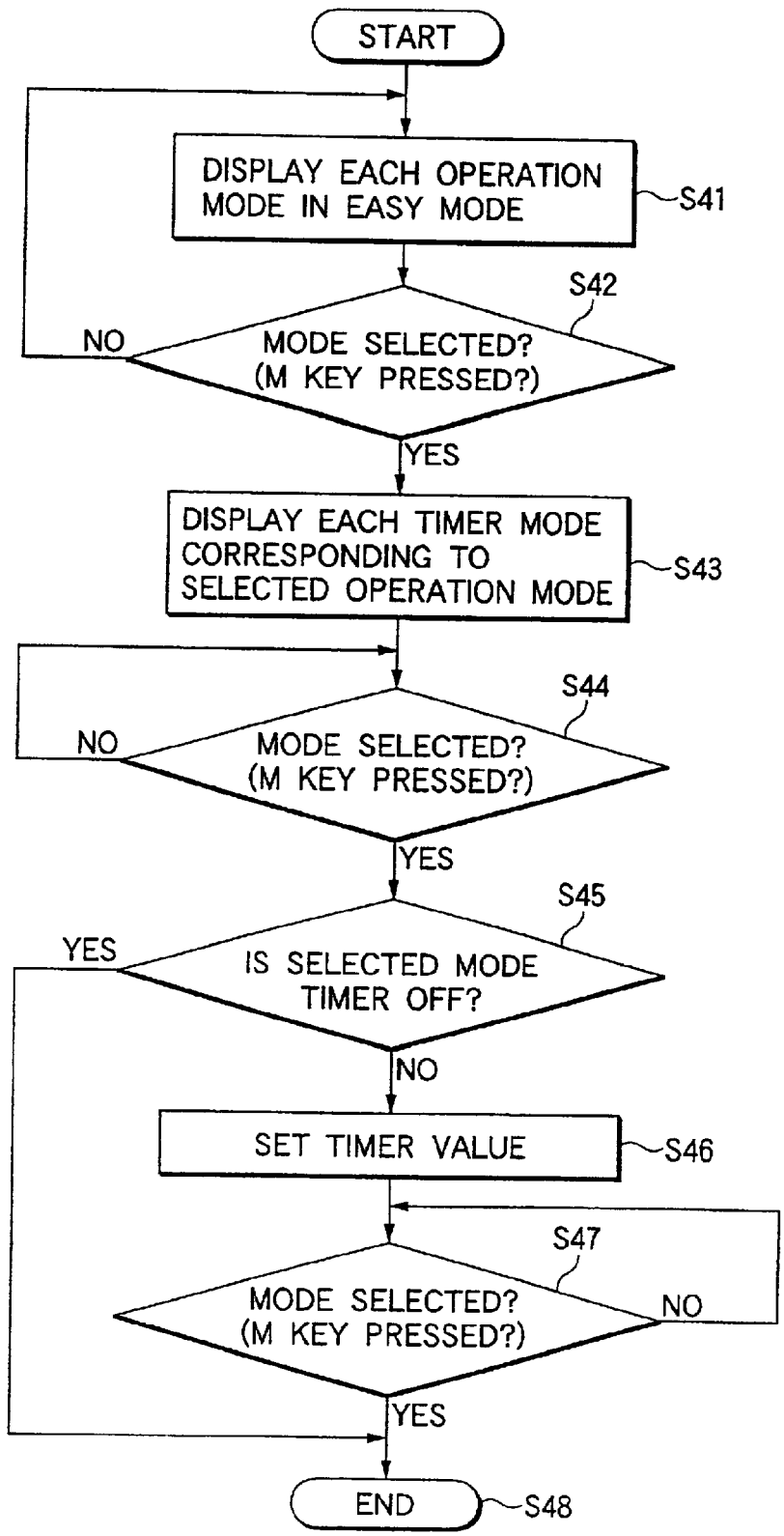
FIG. 14 is a flowchart showing the flow of items displayed in the "Easy" mode.

FIG. 14 is a flowchart to describe the contents concerning the items displayed and settings in the "Easy" mode.

Upon completion of the process previously described with reference to the flowchart of FIG. 13, at step S41 in FIG. 14, the "operation function setting" mode is executed as the "Easy" mode (FIG. 12). The items concerning "operation mode switch" are displayed initially in the "Easy" mode. If the operation mode needs to be switched, any desired operation mode is selected and the M key 23 is pressed. Then, control goes to step S43 from step S42 and the display is switched to the items concerning "timer mode switch and timer value setting" (FIG. 12).

The display in "timer mode switch and timer value setting" will now be discussed. The display "toFF" in FIG. 12 means the timer mode is OFF. Therefore, if "toFF" is selected, the timer mode control described above is canceled and when the photoelectric switch 100 detects the detected object T, it immediately outputs a detection signal. If the M key 23 is pressed, the display is switched to the next display. The display "on-d" in the first display section 17 is an indication concerning the delay time when the photoelectric switch 100 sends an on signal to an external machine, and the numeral "40" on the right indicates the setup delay time (in seconds).

In FIG. 12, the character string "on-d" is surrounded by an ellipse. This ellipse means that the character string "on-d" is blink-displayed. This visually indicates that the item surrounded by the ellipse can be switched to any other display or the numeric value can be changed as the up/down key 21 is operated by pressing the UP or DOWN portions. The same holds true with regard to other drawings as well as FIG. 12. When an ellipse is added to the first or second display section 17 or 18 in the drawings, it means that the entry is blink-displayed. As mentioned above, this indicates that the entry surrounded by the ellipse can be switched to any other display or the numeric value can be changed as the up/down key 21 is operated by pressing the UP or DOWN portions. Such a display form is not limited to the blink display and any display form may be adopted that is a visually discriminating method for the user based on how the entry is displayed, for example, in a different color from the normal color.

Each time the up/down key 21 is operated UP with "on-d" blink-displayed, the first display section 17 changes to a character string of "oFFd" and to a character string of "SHot" and then returns to display "on-d."

The display "oFFd" is an indication concerning the delay time when the photoelectric switch 100 sends an off signal to an external machine, and the numeral corresponding to the delay time is displayed in the second display section 18 (not shown). The display "SHot" is an indication concerning the one-shot control described above, and the numeral corresponding to the delay time is displayed in the second display section 18 (not shown).

For example, if the output of an off signal is delayed, as seen in FIG. 12, the M key 23 is pressed with "oFFd" blink-displayed (step S44 in FIG. 14), whereby the numeral in the second display section 18 is switched to blink display (step S45). The up/down key 21 is operated in this state, whereby the displayed numeral can be incremented or decremented (step S46). If any desired numeral is displayed, then operation of the up/down key 21 is stopped and the M key 23 is pressed (step S47), whereby output of the off signal of the photoelectric switch 100 can be delayed for as much long as the displayed numeric value in seconds. Delay of the on signal and delay of the one-shot signal can be set by performing similar operations.

Upon completion of the timer mode switch based on pressing the M key 23 (step S48) as mentioned above, setting the "operation function setting" mode in the "Easy" mode is complete and the display returns to the basic display information (FIG. 5).

FIG. 15 shows a display list concerning operation function setting in the "Pro" mode.

In the "Pro" mode, as the M key 23 is pressed, the operation mode switch is switched among the timer mode switch, APC switch, differential mode switch, display mode switch in the "light reception amount and/or threshold value display" mode of the basic display information, eco mode switch, and display value shift switch. As the M key 23 is further pressed, the "operation function setting" mode is exited and the mode returns to the "light reception amount and/or threshold value display" mode of the basic display information (FIG. 5).

Menu selection and incrementing or decrementing a numeric value in the display items of operation mode switch, timer mode switch, etc., displayed in the "Pro" mode are executed by operating the up/down key 21 as in the "Easy" mode.

The display value shift switch of the last display item in the "Pro" mode will now be discussed. The character string "ShFt" in the first display section 17 is short for shift and indicates that the current mode is the display value shift switch. The display "oFF" in the second display section 18 means that display value shift switch control is off. If the M key 23 is pressed, the display value shift switch control is set to off and the numeric value corresponding to the actual light reception amount is displayed in the "light reception amount and/or threshold value display" mode of the basic display information (FIG. 5).

On the other hand, if the up/down key 21 is operated, the second display section 18 on the right is switched to the character string "on," which means that display value shift switch control is on. If the M key 23 is pressed in this state, the post-shifted light reception amount is numerically displayed in the second display section 18 (in the example shown in the figure, this value is 1224). On the other hand, the shift amount (in the example in the figure, this value is 10) is displayed for one second in the first display section 17 and then the character string "ShFt" is displayed for approximately 0.25 seconds. After this, the sequence is repeated.

While seeing the character string "ShFt" displayed repeatedly in the first display section 17 and the numeric value of the shift amount, the user can set an appropriate shift amount seeing the numeric value of the post-shifted light reception amount in the second display section 18. The up/down key 21 is operated by pressing the UP portion, whereby the numeric value of the shift amount can be increased and the result is immediately reflected on the second display section 18. In contrast, when the up/down key 21 is operated by pressing the DOWN portion, the numeric value of the shift amount can be decreased and the result is immediately reflected on the second display section 18 on the right.

The first embodiment has now been described. Preferably, the previously selected item is displayed as the top display item, for example, the item concerning the display to select one from among several options and set it on the "Easy" mode or "Pro" mode selection menu (first display section 17 in FIG. 8), the operation mode switch (FIG. 12, FIG. 15), the display mode switch (FIG. 15), etc. In FIG. 8, for example, if the "Pro" mode is previously selected, when the operation mode setting mode is next entered, the character string "Pro" may be first displayed.

According to the embodiment, the two entries contained in the "Easy" mode, namely, (1) the operation mode switch and (2) the timer mode switch and timer value setting are sufficient for the normal use. The basic operation of the photoelectric switch 100 can be provided sufficiently by setting these two entries. Therefore, in the normal use mode, if the "Easy" mode is selected, the setting operation can be completed without displaying the unnecessary entries. The same holds true regarding the "light reception amount and/or threshold value display" mode of the basic display information for enabling the user to select the "Std" mode for producing a partial display or the "Full" mode for producing a full display.

When the "Easy" mode is selected, the display entries can be narrowed down to the minimum necessary and thus the number of times the M key 23 is pressed accompanying the setting operation can be drastically reduced. In other words, there is no fear of also displaying the entries that may remain in their default values in the normal use mode and changing the settings of these values by mistake. Even if an erroneous setting is made in a display item in the "Easy" mode, the number of times that the M key 23 must be pressed to return to the erroneously setup item can be drastically reduced, and the complicated procedure of setting it again can be eliminated.

The user who wants to make advanced settings may select the "Pro" mode and set a rational parameter for the user. For such a user, it is important that the settings of all of the functions of the photoelectric switch 100 can be changed or switched. Often the user is also familiar with handing the photoelectric switch 100. Therefore, the fear of making an erroneous setting is small. The character string of "Pro" is displayed for selection, so that the user can be prompted to be careful about the subsequent operation and thus a preferred man-machine interface can be provided.

If the photoelectric switch 100 contains the function of first displaying the character string "Pro" when the operation mode setting mode is entered again if the "Pro" mode is previously selected, the need for operating the up/down key 21 to identify the character string as "Pro" is eliminated. Thus the "Pro" mode can be entered simply by pressing the M key 23. Therefore, for example, if an erroneous setting is made in an item displayed in the "Pro" mode and again the "Pro" mode must be entered, occurrence of a complicated key or switch operation can be circumvented as the "Easy" or "Pro" mode selection step is provided.

Second Embodiment (FIGS. 16 to 21)

Figure 16:
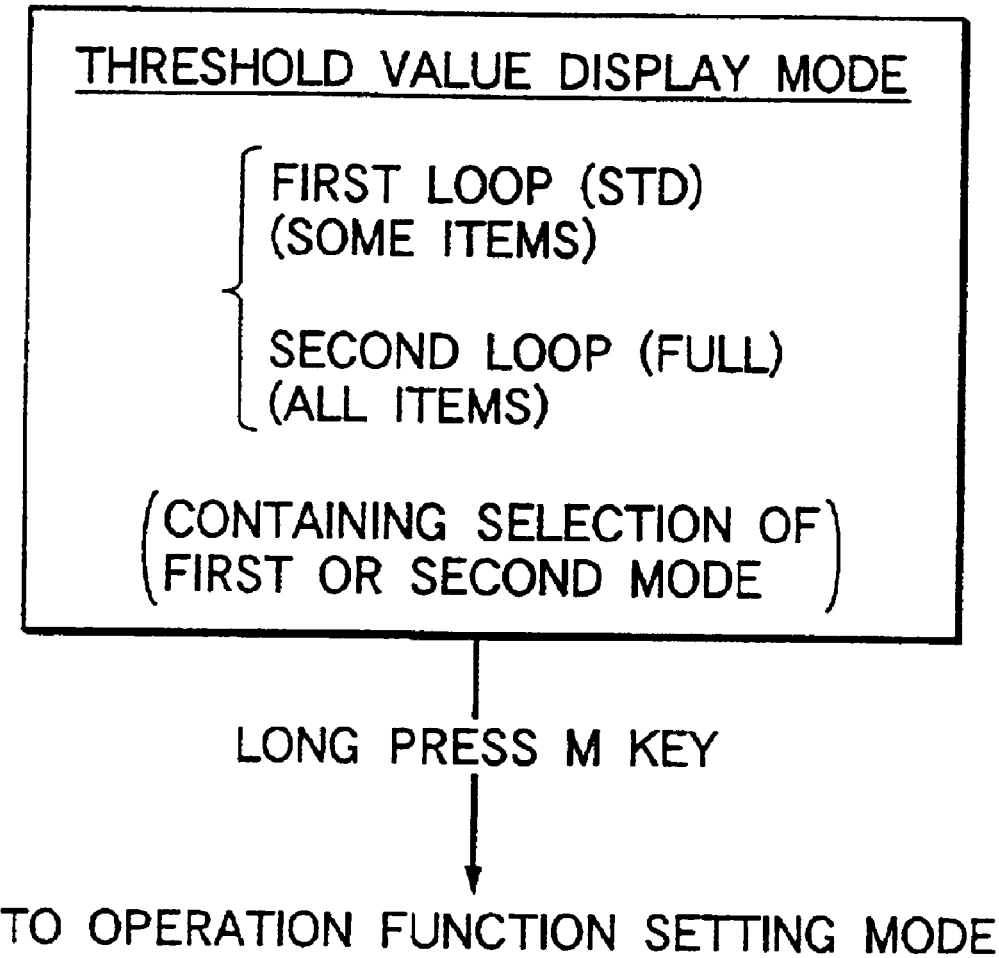
FIG. 16 is a schematic representation of an outline of a display method according to a second embodiment of the present invention.

FIG. 16 shows an outline of a second example concerning the display in the photoelectric switch 100. The second embodiment differs from the first embodiment in that a "light reception amount and/or threshold value display" mode of a basic display information contains a "Std" mode or "Full" mode selection step for the basic display information.

Figure 17:
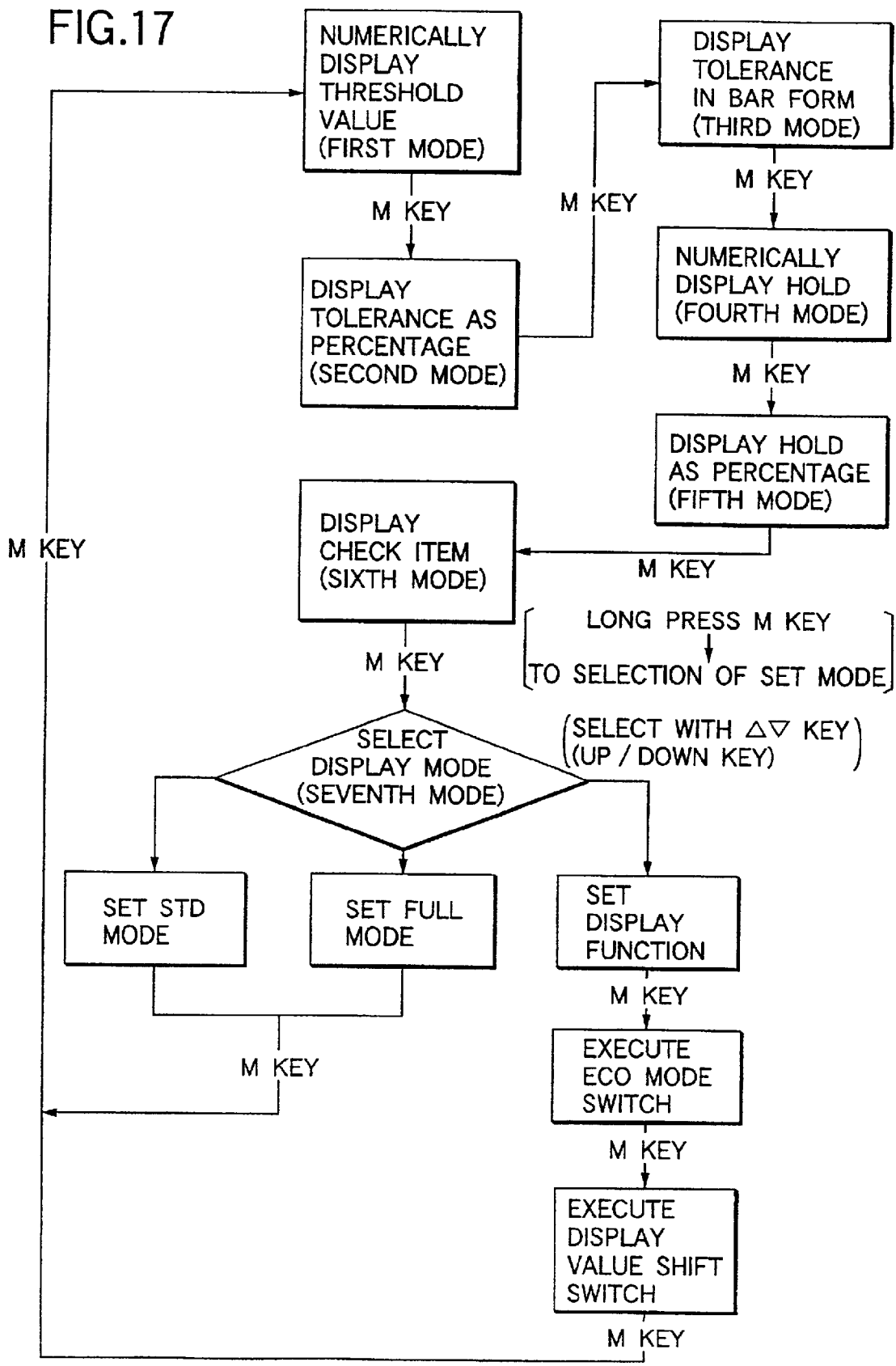
FIG. 17 is a flowchart to describe the flow of items displayed in a basic information display ("Full" mode display) in the second embodiment.
Figure 18:
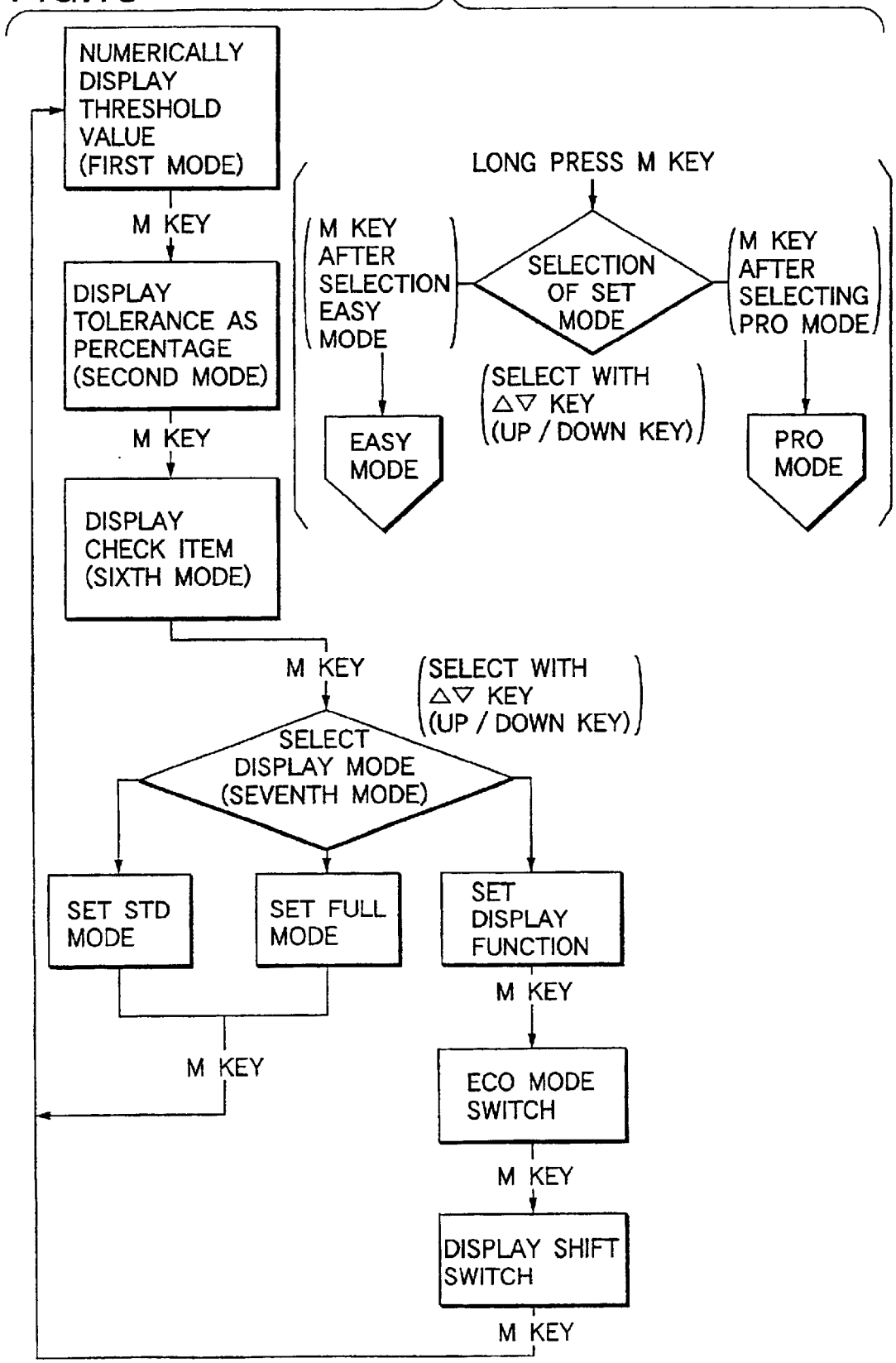
FIG. 18 is a flowchart showing the flow of items displayed in the basic information display ("Std" mode display) in the second embodiment.

FIG. 17 shows the flow path for the light reception amount and/or threshold value display in the "Full" mode for producing a full display. FIG. 18 shows the flow path of the light reception amount and/or threshold value display in the "Std" mode for producing a partial display. The first display mode (numeric display of the threshold value: Current light reception amount (current value)) to the sixth display mode for displaying the current setup operation mode on the basic display information are similar to those previously described with reference to FIG. 5 in the first embodiment.

Also in the second embodiment like the first embodiment, the swing-type threshold value adjustment switch (or up/down key) 21 can be operated for adjusting the setup threshold value on every display mode of the first to fifth display modes. Also, the threshold value is set as a new threshold value when operation of the up/down key 21 is stopped.

Also in the second embodiment like the first embodiment, if operation of the up/down key 21 is started on any of the third to fifth display modes, instantaneously the display mode is automatically switched to the second display mode. Then while the up/down key 21 is operated, the second display mode is maintained and when operation of the up/down key 21 is stopped, the second display mode is returned to the former display mode of the third to fifth display modes.

Figure 19:
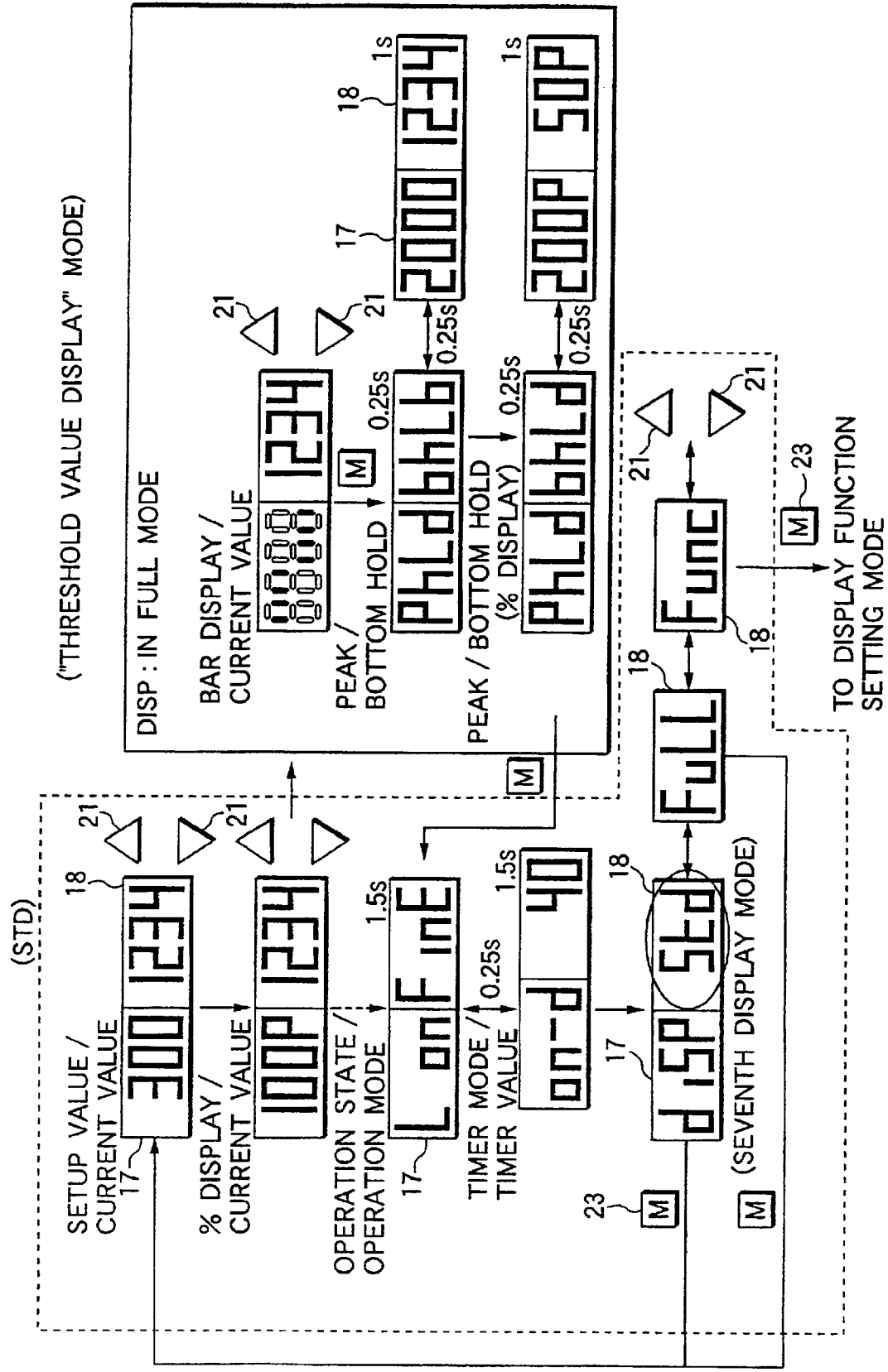
FIG. 19 is a drawing showing the display form of the basic information display in the second embodiment and the flow of the display items in the basic information display.
Figure 20:
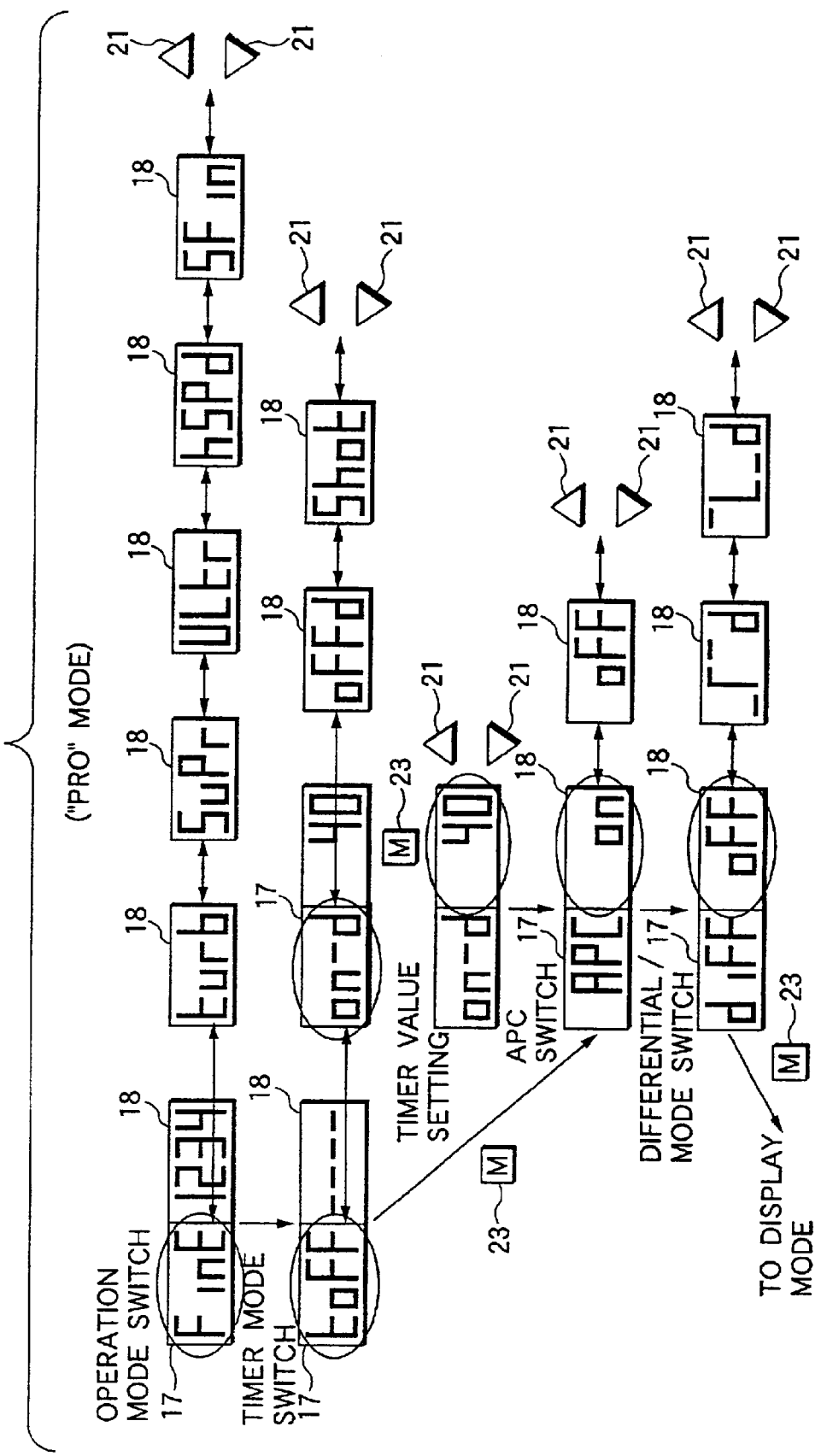
FIG. 20 is a drawing showing the display form in the operation function setting mode of the second information display in the second embodiment and the flow of display items in the operation function setting mode.

In the second embodiment, as seen in FIG. 19, if the M key 23 is pressed for a comparatively short time on the sixth display mode displaying the operation state, a transition is made from the sixth display mode to the seventh display mode and a character string of "diSP" is displayed in the first display section 17 and a character string of "Std," etc., is displayed in the second display section 18.

The character string "diSP" is short for "display" and has a meaning to set a display method in the threshold value display mode. The user can select any of the three menu items on the seventh display mode. That is, the seventh display mode contains (1) a "Std" mode selection menu item for displaying limited items of the "light reception amount and/or threshold value display," (2) a "Full" mode selection menu item for displaying all of the items, and (3) a transition to a display function setting mode (FIG. 20) (display "Func").

On the seventh display mode, the character string "diSP" is displayed in the first display section 17. On the other hand, in the second display section 18, the character string "Std" is changed to "Full" and "Func" in order and again "Std" is displayed as the up/down key 21 by pressing the UP portion. In contrast, as the up/down key 21 is pressed on the DOWN portion, the display contents of the second display section 18 changes from "Func" to "Full" and from "Full" to "Std."

If the M key 23 is pressed for a comparatively short time when the character string "Std" is displayed in the second display section 18 on the right, the "Std" mode can be set. Accordingly, the display in the "light reception amount and/or threshold value display" mode is switched to the "Std" mode (left loop in FIG. 18, FIG. 19).

If the M key 23 is pressed for a comparatively short time when the character string "Full" is displayed in the second display section 18, the "Full" mode can be set. Accordingly, the display in the "light reception amount and/or threshold value display" mode becomes the "Full" mode for displaying all items (see FIG. 17, FIG. 19).

Figure 21:
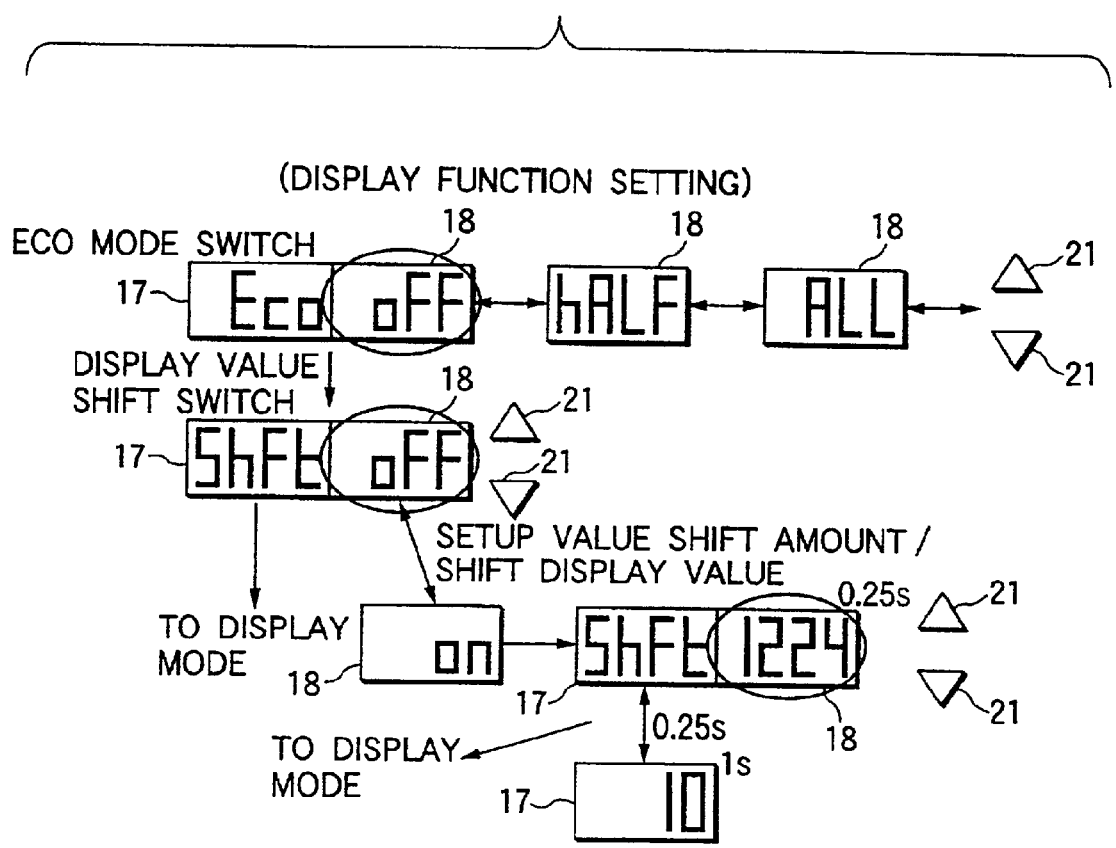
FIG. 21 is a drawing showing the display form in display function setting mode of the third information display in the second embodiment and the flow of display items in the display function setting mode.

The M key 23 is pressed when the character string "Func" is displayed in the second display section 18, whereby the "light reception amount and/or threshold value display" mode is exited and a transition is made to a "display function setting" mode shown in FIG. 21. To make the transition to the "display function setting" mode, the M key 23 may be pressed for at least a comparatively short time.

As seen in FIG. 21, the "display function setting" mode has two items: (1) an eco mode switch and (2) a display value shift switch. If the M key 23 is pressed, a transition is made from the "eco mode switch" to the "display value shift switch". If the M key 23 is pressed in the "display value shift switch," the mode returns to the "light reception amount and/or threshold value display" mode.

Since "display" contained in the "Pro" mode in the first embodiment is added to the "light reception amount and/or threshold value display" mode in the second embodiment, the "display" item is omitted from the "Pro" mode in the second embodiment. Likewise, since the "eco mode switch" and the "display value shift switch" contained in the "Pro" mode in the first embodiment are executed in the "display function setting" mode separate from the "light reception amount and/or threshold value display" mode and "operation function" mode in the second embodiment, the "eco mode switch" and the "display value shift switch" items are omitted from the "Pro" mode in the second embodiment.

According to the second embodiment, the items concerning the "display" are omitted and separated from the "Pro" mode, so that the number of display items in the "Pro" mode can be reduced and complexity of the key or switch operation in the "Pro" mode can be decreased. Even the person who does not have knowledge of the photoelectric switch 100 and they select the "Pro" mode might want to change setting for the display. To do this, the user can enter the "display" mode in a loop separate from the "Pro" mode without entering the "Pro" mode.

Third Embodiment (FIGS. 22 to 25)

In the third embodiment, compared to the first and second embodiments, an "operation function setting" mode of the second display information does not have a switchable display group for an "Easy" mode or a "Pro" mode. In the third embodiment, in the "operation function setting" mode, first, the frequently used display items are displayed and next the user selects to proceed with the display of the less frequently used display items or to return to a "light reception amount and/or threshold value display" mode of a basic display information. In the third embodiment, the "light reception amount and/or threshold value display" mode of the basic display information is similar to that in the first and second embodiments and therefore it will not be discussed again.

Figure 22:
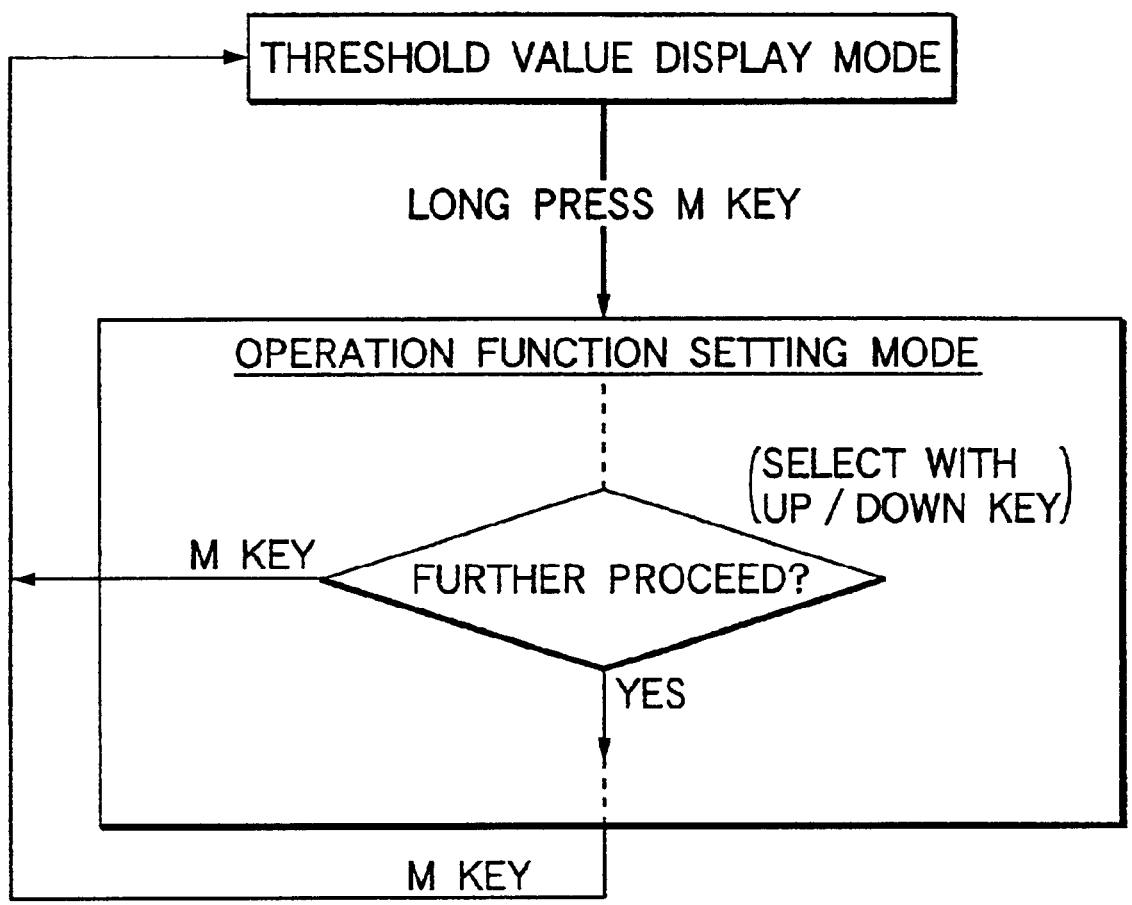
FIG. 22 is a schematic representation of an outline of a display method according to a third embodiment of the present invention.
Figure 23:
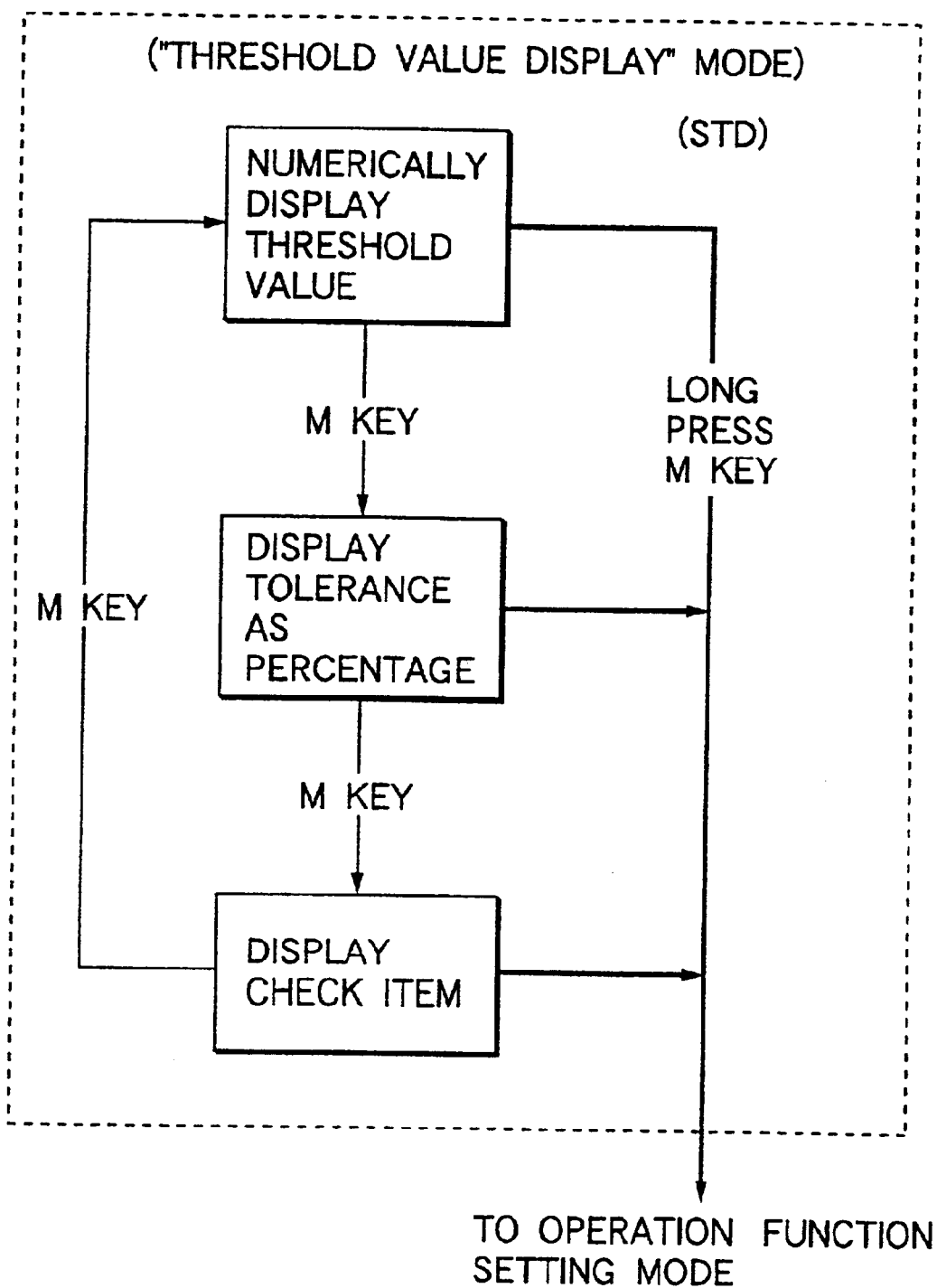
FIG. 23 is a drawing showing switching from the basic information display directly to an operation function setting mode of the second information display in the third embodiment.
Figure 24:
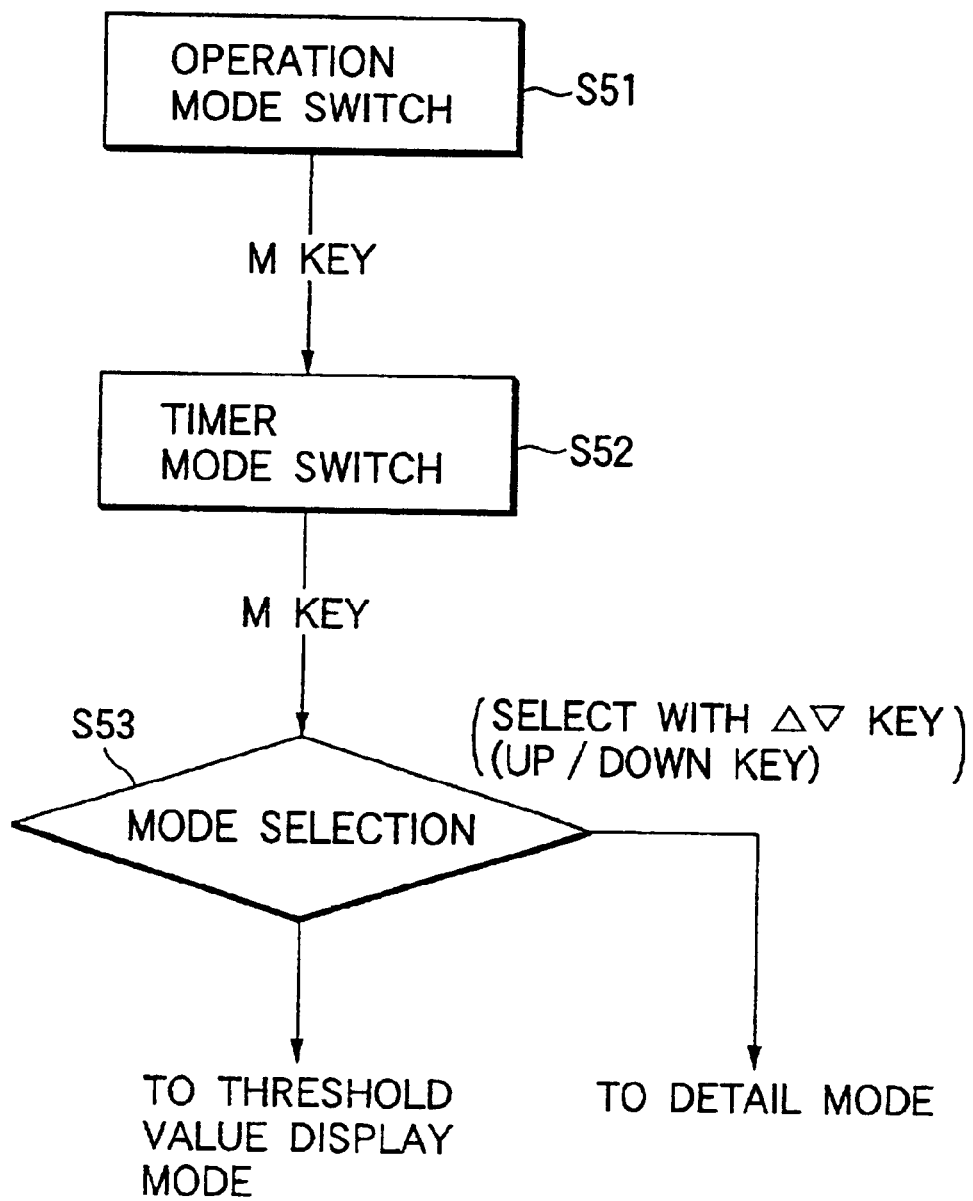
FIG. 24 is a drawing showing the step of selecting an advancing item display in the operation function setting mode in an intermediate point of a display flow of items in the operation function setting mode of the second information display according to the third embodiment.

FIGS. 22 to 24 show an outline of a display flow according to the third embodiment. For example, if the M key 23 is long pressed when some item in the "light reception amount and/or threshold value display" mode of the basic display information is displayed in an "Std" mode in FIG. 23, the display is switched to the "operation function setting" mode of the second display information as seen in FIG. 22. In the "operation function setting" mode, first one or more of the frequently used items (the same as those in the "Easy" mode described above) are displayed in order (whenever the M key 23 is pressed, the items are switched in order). Upon completion of the display of, for example, two items that are frequently used, a transition is made to the third display item and a selection menu for the user to select the display of any other item concerning the "operation function setting" mode or to return to the basic display information ("light reception amount and/or threshold value display" mode).

If the user wants to set further detailed items, he or she selects "proceed or enter (Ent)" and additional items are displayed accordingly. On the other hand, if additional setup items need not be displayed, the user selects "not proceed (PASS)." Then, the "operation function setting" mode of the second display information is completed and the display in first and second display sections 17 and 18 returns to the basic display information ("light reception amount and/or threshold value display" mode) accordingly.

Figure 25:
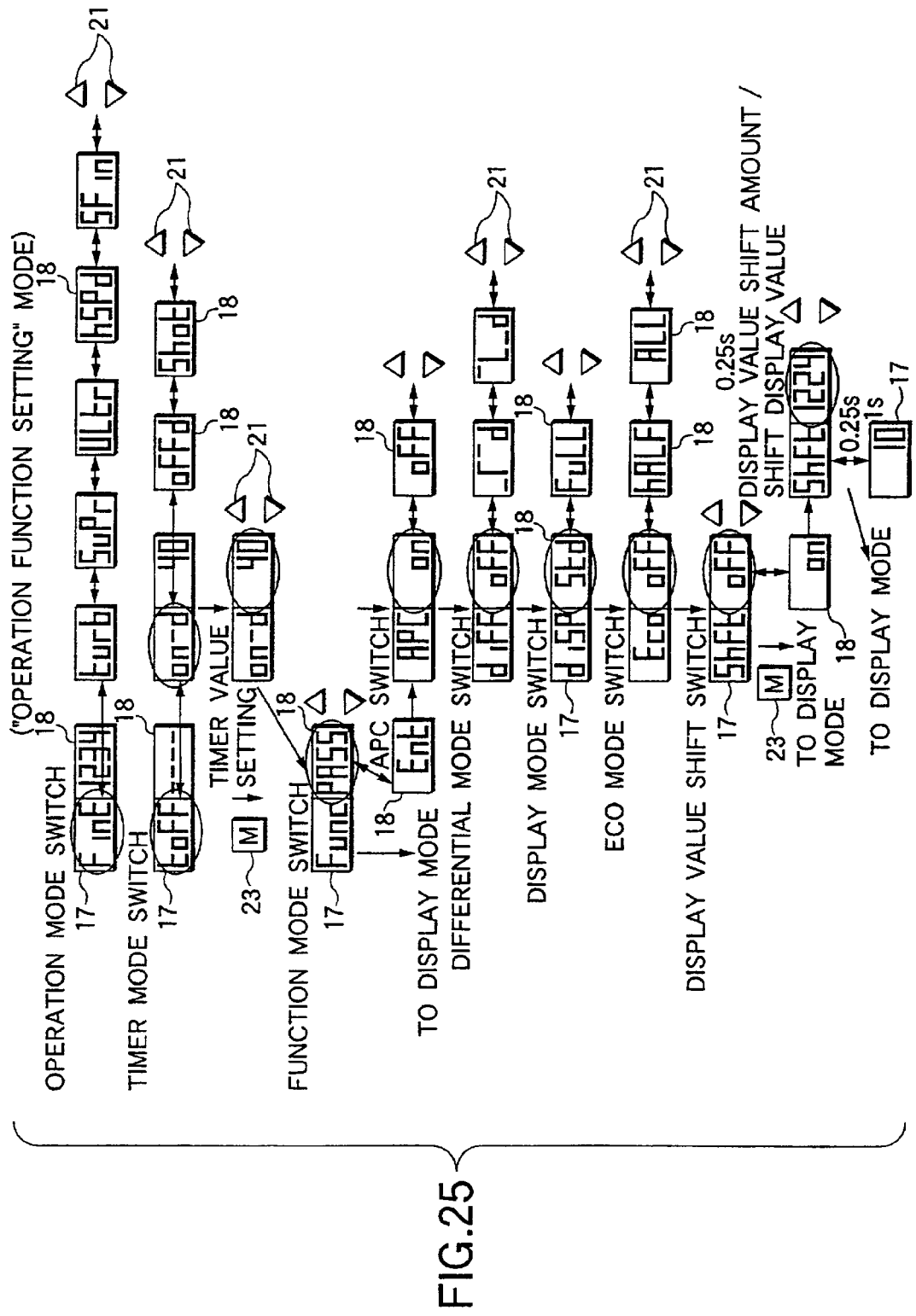
FIG. 25 is a drawing showing the information display form in the operation function setting mode if the second display information of the third embodiment and the flow of display items in the operation function setting mode.

FIG. 24 shows a flow path of the "operation function setting" mode of the second display information. FIG. 25 shows a detailed flow of the "operation function setting" mode. When a transition is made from the basic display information ("light reception amount and/or threshold value display" mode) to the second display information ("operation function setting" mode) as the M key 23 is long pressed, first, the display concerning the operation mode switch is produced (step S51). As for the operation mode switch, the user operates the up/down key 21, whereby six menu items are displayed in order and when any desired operation mode is displayed in the first display section 17, the user can press the M key 23, thereby setting the displayed operation mode. That is, the second display information in the third embodiment provides, for example, six operation mode switch menu items as in the "Pro" mode in the first embodiment.

As the M key 23 is pressed, the display in the first and second display sections 17 and 18 is switched to the second display, timer mode switch display (step S52). As for the timer mode switch display, the user uses the up/down key 21 to change the menu and the numeric value. When any desired menu item and numeric value are displayed, the user can press the M key 23, thereby setting the timer based on the display contents, as previously described in the first embodiment.

Upon completing the setting of the timer as the M key 23 is operated, the display is switched to the function mode switch menu for selecting to "further proceed" or "not proceed" (step S53). A character string of "Func" is displayed in the first display section 17 and a character string of "PASS" is displayed in the second display section 18, as shown in FIG. 25. The character string "PASS" means exiting from the operation function setting mode. If the up/down key 21 is operated, the character string "PASS" displayed in the second display section 18 is switched to a character string of "Ent," which means to further continue with the operation function setting mode.

If the M key 23 is pressed when "PASS" is displayed in the second display section 18, the second display information ("operation function setting" mode) is exited and the display returns to the basic display information ("light reception amount and/or threshold value display" mode). On the other hand, if the M key 23 is pressed when "Ent" is displayed in the second display section 18, the "operation function setting" mode is continued and a detailed operation function setting of items for the APC switch, etc., for example, previously described as the "Pro" mode in the preceding embodiment is carried out.

According to the third embodiment, in the "operation function setting" mode, the items concerning the basic operation of the photoelectric switch 100 or the frequently used items are displayed first and "Func" is displayed as a caution before displaying any of the special setup item are entered. Thus, if it is sufficient for the user to set only the basic operation, they can exit from the "operation function setting" mode at that time, thereby omitting the subsequent complicated key or switch operations.

Fourth Embodiment (FIGS. 26 to 31)

Figure 26:
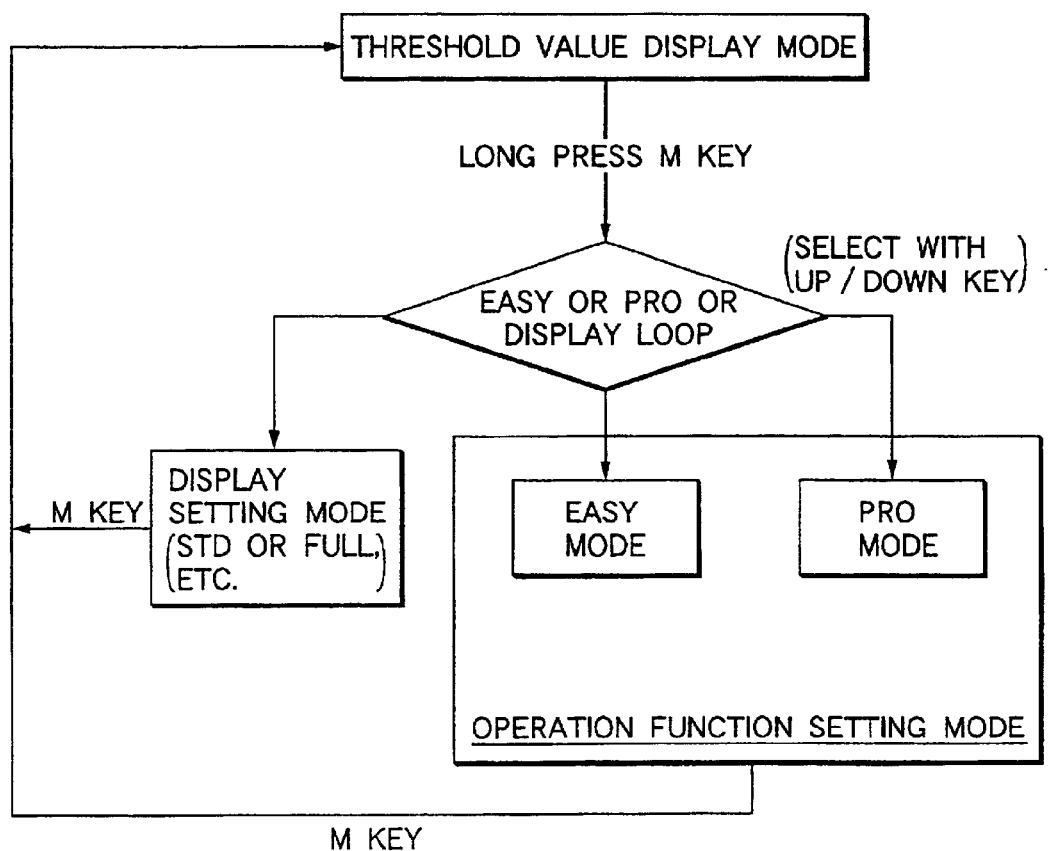
FIG. 26 is a schematic representation of an outline of a display method according to a fourth embodiment of the present invention.
Figure 27:
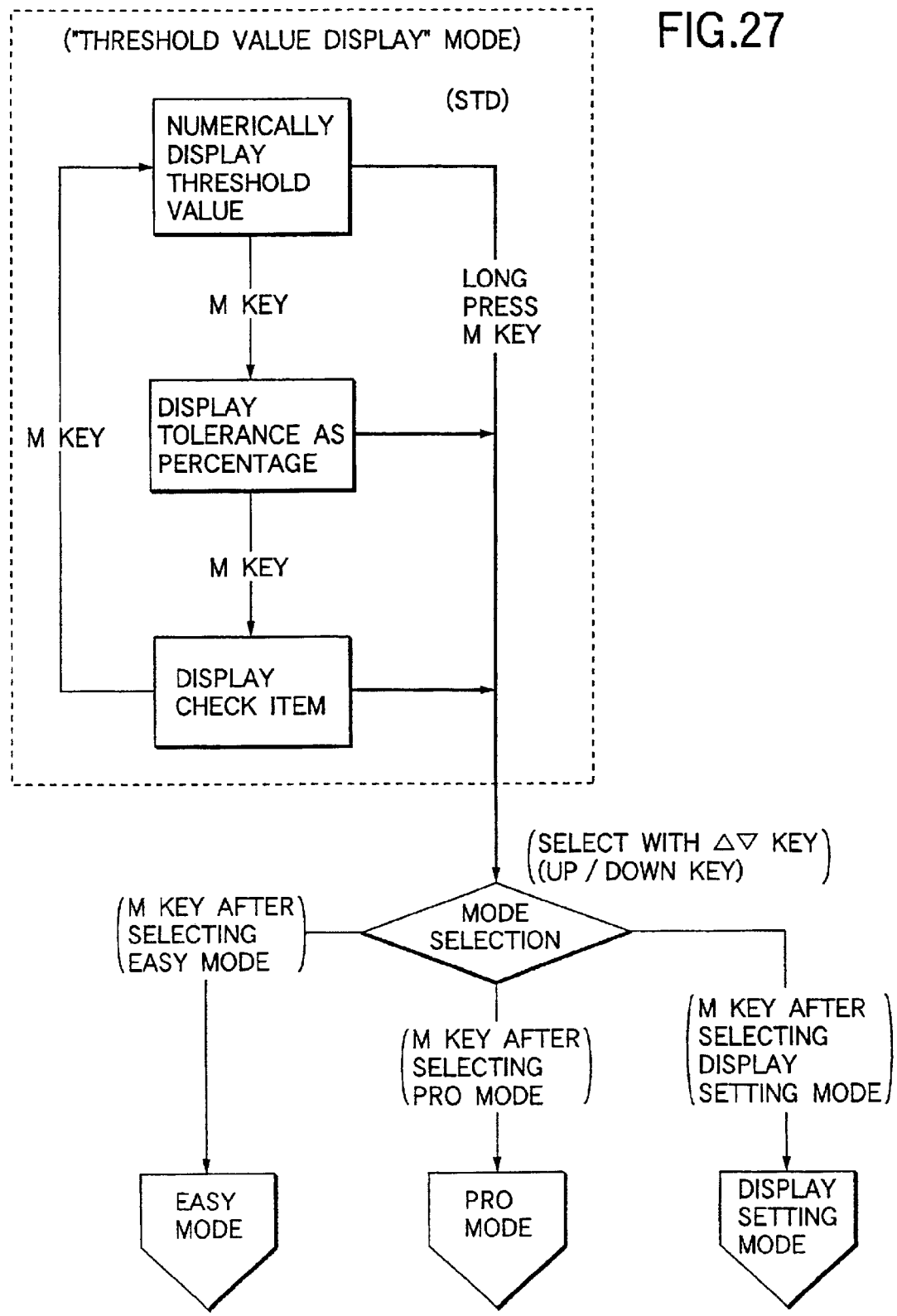
FIG. 27 is a flowchart showing the flow from a basic display mode ("Std" mode) to a mode selection to display the second or third information display in the selected mode in the selection step.

The display in the fourth embodiment is roughly classified into a "light reception amount and/or threshold value display" mode of the basic display information, an "operation function setting" mode of the second display information, and a "display setting" mode of the third display information. If the M key 23 is long pressed in the "light reception amount and/or threshold value display" mode, a selection step of the "operation function setting" mode of the second display information or the "display setting" mode of the third display information is entered as seen in FIG. 26 and FIG. 27 showing the "light reception amount and/or threshold value display" mode in a "Std" mode as illustrated.

For the "operation function setting" mode, the options of "Easy" and "Pro" are provided. Therefore, if the user long presses the M key 23 in the "light reception amount and/or threshold value display" mode, they can select any desired option from among the "Easy", "Pro", and "display setting".

Figure 28:
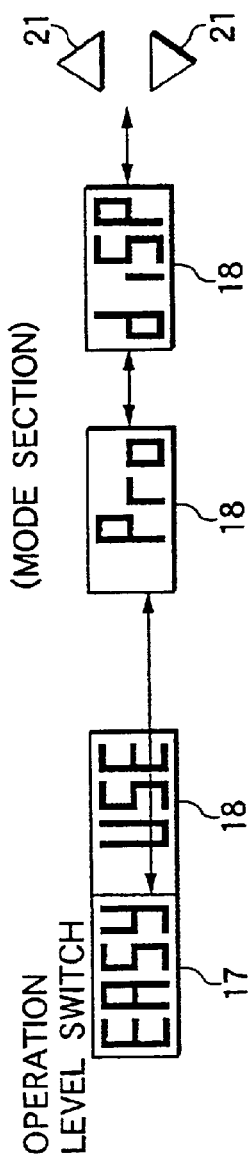
FIG. 28 is a drawing showing the mode selection in the fourth embodiment.

FIG. 28 shows the display first appearing in display sections 17 and 18 after the M key 23 is long pressed in the "light reception amount and/or threshold value display" mode of the basic display information. First, the character string "Easy" appears in the first display section 17 and as the up/down key 21 is operated by pressing the UP portion, the character string "Pro" appears in the first display section 17. As the up/down key 21 is further operated by pressing the UP portion, a character string of "diSP" appears in the first display section 17. The character string "diSP" is short for "display" and means the "display setting" mode. As the up/down key 21 is further operated by pressing the UP portion, the first display section 17 returns to the character string "Easy." In contrast, if the up/down key 21 is operated by pressing the DOWN portion, the display order of the display contents is reversed.

Figure 29:
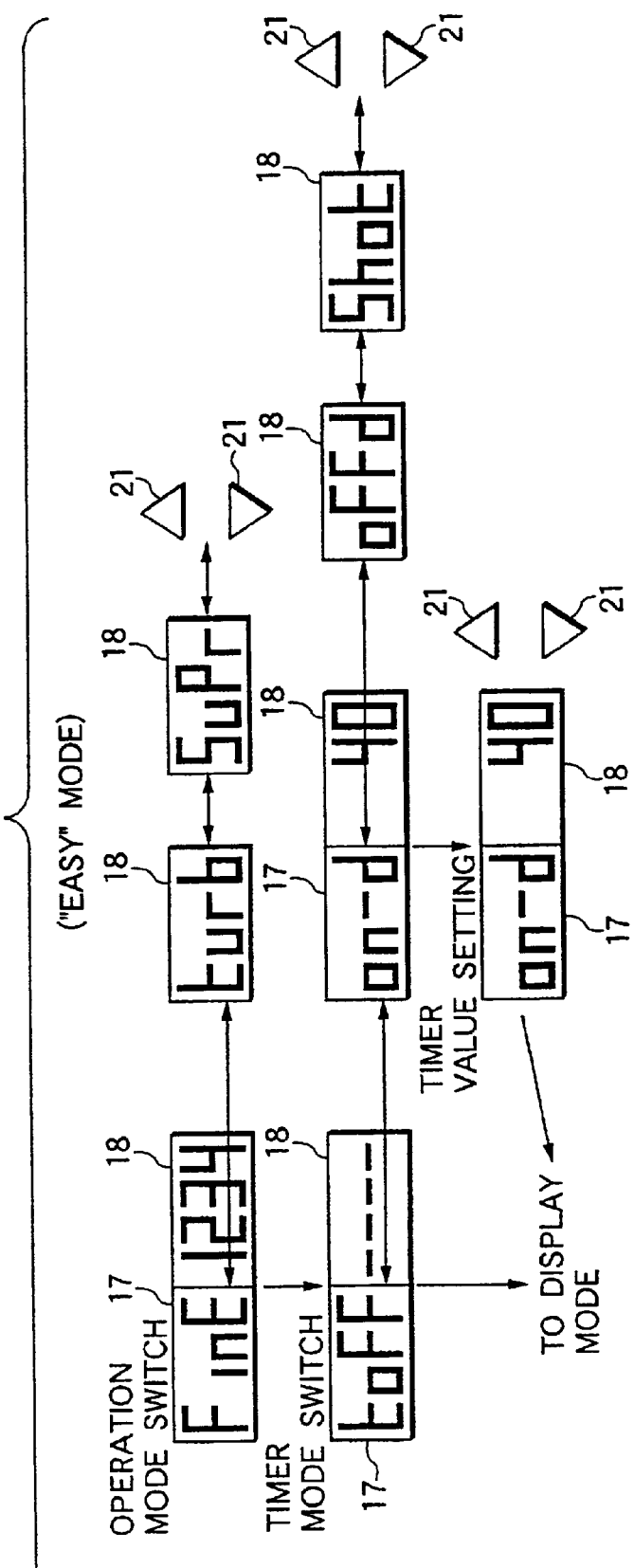
FIG. 29 is a drawing showing the display form in an "Easy" mode concerning the second information display in the fourth embodiment and the flow of display items in the second display information.
Figure 30:
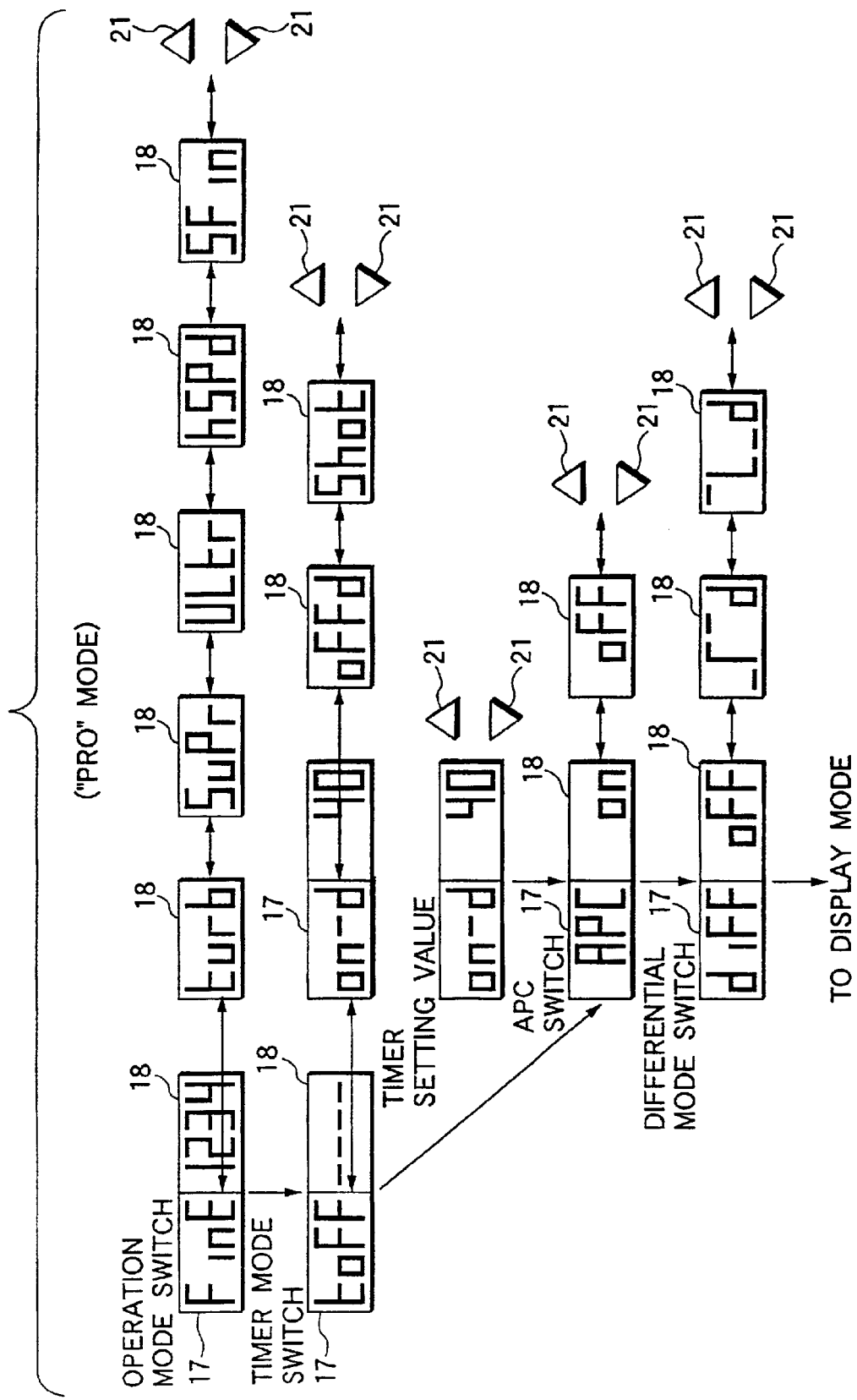
FIG. 30 is a drawing showing the display form in a "Pro" mode concerning the second display information in the fourth embodiment and the flow of display items in the second display information.

If the M key 23 is pressed when the character string "Easy" is displayed in the first display section 17, the "Easy" mode is selected as the display of the "operation function setting" mode of the second display information (FIG. 29). The "Easy" mode in the fourth embodiment is substantially the same as that described in the first embodiment and therefore it was described above with reference to FIG. 11.

If the M key 23 is pressed when the character string "Pro" is displayed in the first display section 17, the "Pro" mode is selected as the display of the "operation function setting" mode of the second display information (FIG. 29). The "Pro" mode in the fourth embodiment is substantially the same as that described in the second embodiment and therefore it was described above in the discussion of FIG. 20.

Figure 31:
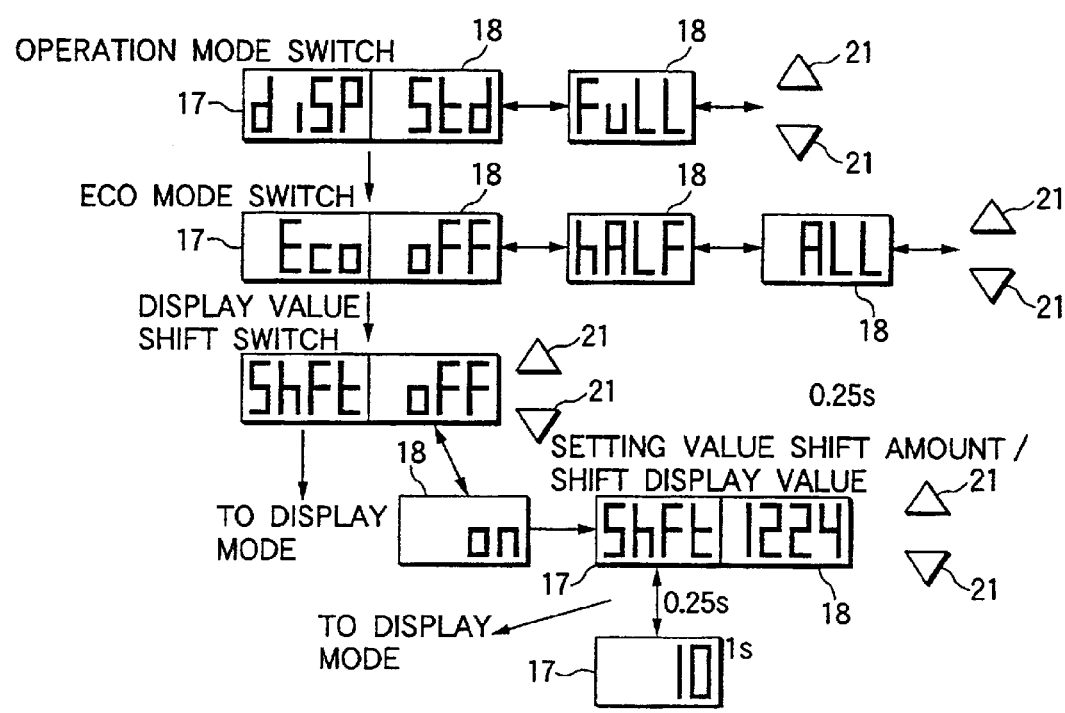
FIG. 31 is a drawing showing the display form in a "display" mode concerning the third information display in the fourth embodiment and the flow of display items in the third display information.

If the M key 23 is pressed when the character string "diSP" is displayed in the first display section 17, a transition is made to the "display setting" mode of the third display information shown in FIG. 31. As the M key 23 is pressed in the "display setting" mode, three items: (1) the selection of the display mode of "Std" or "Full" in the "light reception amount and/or threshold value display" mode for the basic display information, (2) the eco mode switch, and (3) the display value shift switch are displayed. As the M key 23 is further pressed, the mode returns to the "light reception amount and/or threshold value display" mode of the basic display information.

The photoelectric switch 100 of a dual monitor type comprising the first and second display sections 17 and 18 has been described by way of example. In the photoelectric switch 100 of dual monitor type, in the "light reception amount and/or threshold value display" mode, the tolerance value and the current light reception amount are displayed at the same time with the second display mode and the third display mode, as described above, so that the user can adjust the threshold value while seeing the display. When finely adjusting the threshold value in response to the detection environment, the user visually checks that the light reception amount is extremely small, for example, and then they can immediately know the fact that the photoelectric switch is close to the performance limit for functioning as a detection switch. Therefore, the user can reassess the detection environment and immediately improve it while adjusting the threshold value. Formerly it was not possible to optimize the threshold value until the threshold value was determined through several trial and error procedures. With the present invention, the improvement of the detection environment and optimization of the threshold value can be carried out efficiently according to the photoelectric switch 100.

When at least either of the first and second display sections 17 and 18 is implemented as two-color LEDs, the user may be aggressively informed of the fact that the photoelectric switch is close to the performance limit for functioning as a detection switch described above by displaying at least either of the first and second display sections 17 and 18 in a different color from the normal color.

In the "light reception amount and/or threshold value display" mode, the maximum value and the minimum value of the light reception amounts are displayed at the same time with the fourth and fifth display modes. Thus, the user can visually check whether or not the light reception amount difference is sufficient for detecting the presence or absence of a detected object even in a detection environment where the detected object moves at a high speed.

In the first embodiment described above, when the M key 23 is long pressed, the "Easy" or "Pro" mode selection menu concerning the setting change is displayed. If the user needs to change or check only the basic settings of the photoelectric switch, they may select the "Easy" mode. Accordingly, the display is narrowed down to the frequently used items for the minimum necessary settings, namely, the basic settings of the photoelectric switch. Thus, even the photoelectric switch comprising a large number of functions would make it possible to eliminate the need for repeating burdensome key operations for jumping all of the items appearing on the display section one after another. Therefore, the user is not annoyed because they are not required to complete unnecessary setting changes including their entering erroneous keys when they intend to jump the unnecessary displays.

On the other hand, if the user uses the large number of functions contained in the photoelectric switch, they can select the "Pro" mode for changing the settings for all of the functions to appropriately set the multifunctional photoelectric switch in response to the detection environment.

Likewise, the "light reception amount and/or threshold value display" mode can also be switched between the Std (standard) display mode for displaying only several items that are frequently used and the full display mode for displaying all of the items. Thus, if the user sees only the numeric value and corrects it, for example, they can set the "Std" display mode for reducing the number of displayed items and eliminating the need for repeating the burdensome key operations thereby jumping all items appearing on the display section one after another.

According to the second embodiment, the setup items concerning the display function are separated from the "operation function setting" mode and the "display function setting" mode (FIG. 26) and can be entered directly from the "light reception amount and/or threshold value display" mode without entering the "operation function setting" mode. In other words, the items concerning the display function setting are removed from the "operation function setting" mode, so that the number of display items in the "operation function setting" mode can be decreased and the number of times the M key 23 is operated can be reduced.

In the first embodiment, for example, even the user who wants to only change the setting concerning the display entering the "Pro" mode with a large number of display items, they cannot change the display setting until they repeat the key operation a large number of times. However, the setting concerning the display can be changed in the "light reception amount and/or threshold value display" mode of the basic display information.

In the first and second embodiments, the "Easy" mode and the "Pro" mode are provided for the user to select either of them according to their desire. In the third embodiment, however, the user can select to enter the function setting menu or to cancel it based on their desire in response to the necessity for the setting change. Therefore, in the normal use state, the user can directly use most of the items concerning the "operation function setting" mode. Of course, if the user needs to set items over a wide range, they may select "Ent" (FIG. 25) to enter the items concerning detailed operation function setting.

Fifth Embodiment (FIGS. 32 to 35)

In the description of the first to fourth embodiments, the photoelectric switch of a dual monitor type comprises two display sections, namely, two screens. Many photoelectric switches have only one display section, namely, a single screen. The invention can also be applied to the photoelectric switch of a single monitor type. An example of a single monitor type of photoelectric switch will be discussed as the fifth embodiment of the invention. The fifth embodiment basically is based on substantially the same concept as the first embodiment. However, application of the invention concerning the photoelectric switch of the single monitor type is not limited to the fifth embodiment and may be based on substantially the same concept as any other embodiment described above.

Also in the fifth embodiment, similar to the first and second embodiments, a step of generally selecting an "Easy" mode (FIG. 33) or a "Pro" mode (FIG. 35) is contained between a "light reception amount and/or threshold value display" mode (FIG. 32) and an "operation function setting" mode (FIG. 33, FIG. 34). FIGS. 32 to 34 show display modes of the photoelectric switch of the single monitor type in each mode. A display section of the photoelectric switch of the single monitor type is denoted by reference numeral 60 to distinguish it from the first and second display sections 17 and 18 of the dual monitor described above.

Figure 35:
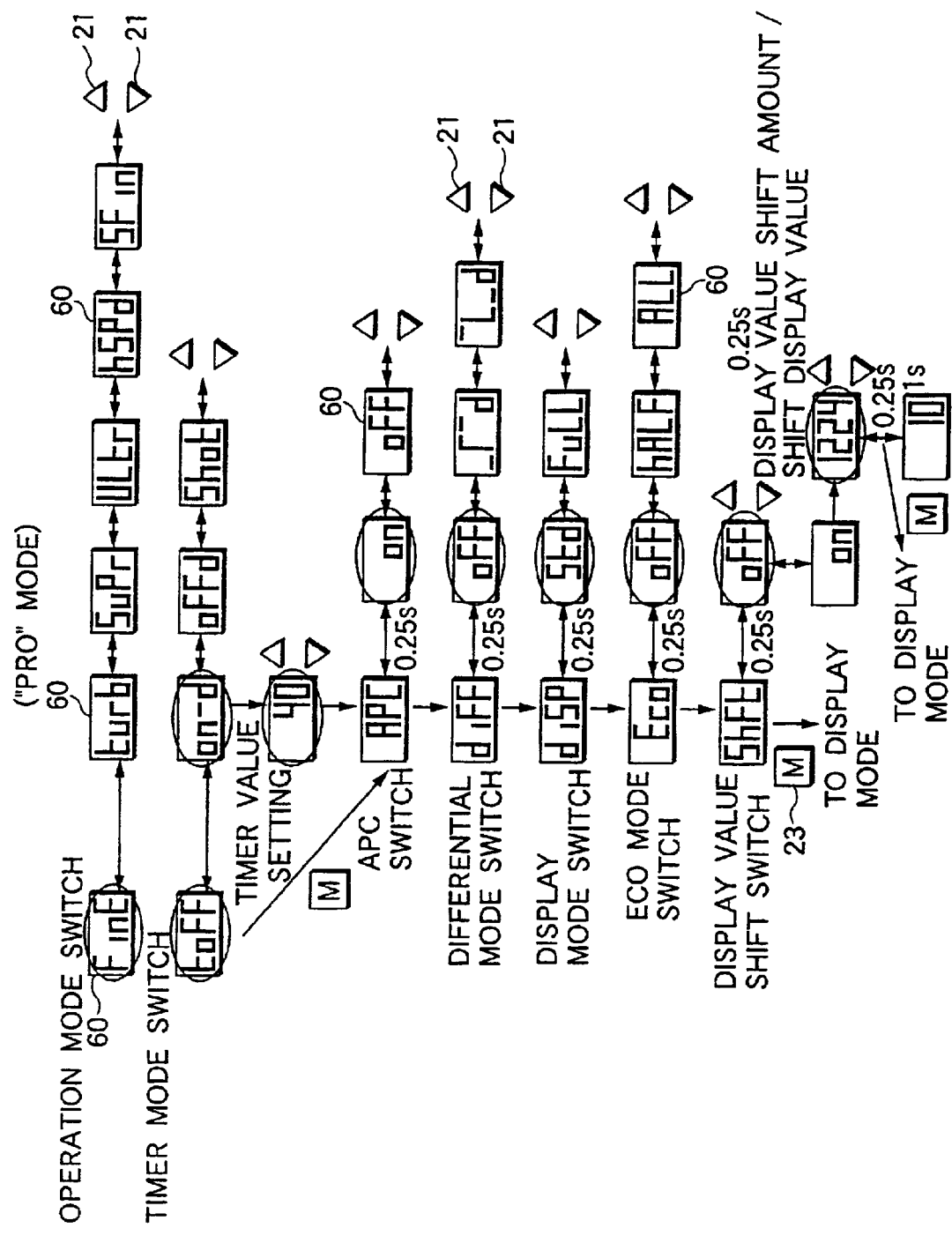
FIG. 35 is a drawing showing the display form and the flow of display items in a "Pro" mode like that of the first embodiment but with only one display section.

Also in the fifth embodiment, similar to the first embodiment, the "light reception amount and/or threshold value display" mode (FIG. 32) can be switched between a "Std" mode and a "Full" mode in a "diSP" (display mode switch of basic display information) entry in the "Pro" mode (FIG. 35).

It can be understood by those skilled in the art from the description of the fifth embodiment that various items can be displayed in the photoelectric switch comprising the single display section based on the same concept as the photoelectric switch 100 of dual monitor type comprising the first and second display sections 17 and 18 of the first to fourth embodiments described above.

The invention has been described by taking the reflection-type and integral-type photoelectric switch 100 comprising the optical fibers 14 and 15 as an example, but the invention is not limited to this type of photoelectric switch. For example, the invention can also be applied to photoelectric switches of the types shown in FIGS. 36 to 40. Elements of the photoelectric switches similar to those of the above-described photoelectric switch 100 are denoted by the same reference numerals in FIGS. 36 to 40.

Figure 36:
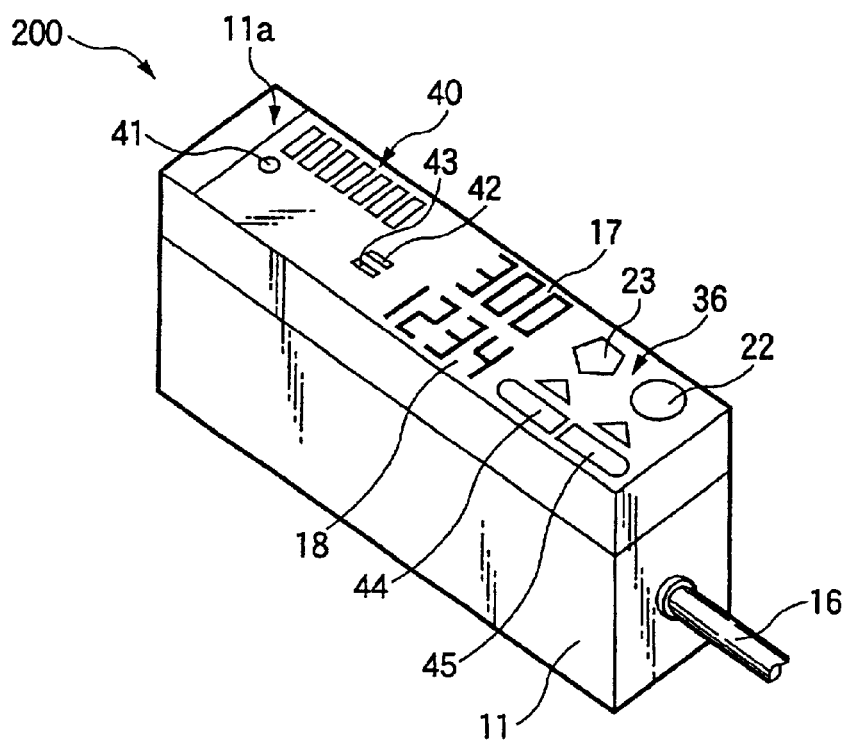
FIG. 36 is a perspective view of a laser-type photoelectric switch that incorporates the present invention.

FIG. 36 shows a photoelectric switch 200 of the type wherein a light emission element 12 and a light reception element (not shown in FIG. 36 for simplification) are placed on one end face of the casing 11 and light emitted from the light emission element 12 is applied to a detected object T and reflected light is received directly at the light reception element. The photoelectric switch 200 adopts a semiconductor laser light emission element as the light emission element 12.

Figure 37:
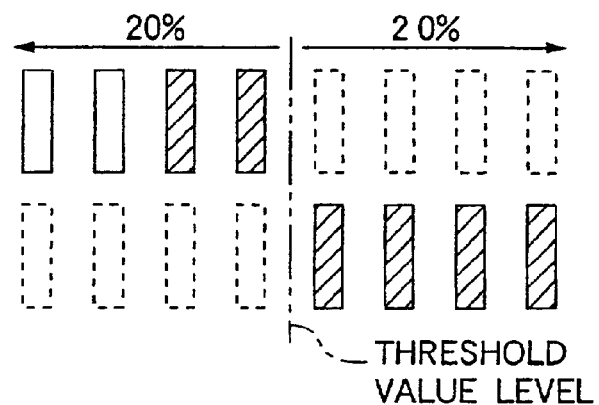
FIG. 37 is an enlarged scale drawings showing a portion of a bar LED monitor placed on the photoelectric switch shown in FIG. 36.

A first display section 17 and a second display section 18 are placed adjacent to each other so that one is on top of the other on a top face 11a of the casing 11 of the photoelectric switch 200. A bar LED monitor 40, a light emission indicator 41, a first hold mode indicator 42, and a second hold mode indicator 43 are also placed on the top face 11a of the casing 11. The above-mentioned swing-type threshold value adjustment switch 21 contained in the first embodiment is implemented as two separate key switches of an up key switch 44 and a down key switch 45. The bar LED monitor 40 displays that the electric current value corresponding to the light reception amount of the light reception element 13 exists in the range of approximately ±20% from a predetermined value (the threshold level). FIG. 37 is a drawing to show the portion of the bar LED monitor 40 on an enlarged scale. As seen in the figure, the bar LED monitor 40 comprises two up and down stages each comprising eight longitudinal LEDs. This composition is substantially the same as the bar form display of the tolerance value previously described with reference to FIG. 6.

If a threshold level is set between the fourth and fifth longitudinal LEDs from the right and one longitudinal LED is set corresponding to a 5% increment or decrement, the tolerance increment and decrement of approximately ±20% from the threshold level can be displayed. If the lower longitudinal LEDs are used for the four longitudinal segments on the right and the upper longitudinal LEDs are used for the four longitudinal segments on the left with the threshold value therebetween, the user can be informed of the threshold level from the on position difference between the fourth lower longitudinal segment from the right and the fifth upper longitudinal segment.

When light is emitted from the light emission element 12, the light emission indicator 41 is turned on. When light emission from the light emission element 12 is stopped, the light emission indicator 41 is turned off. The first hold mode indicator 42 is turned on when a first hold mode for holding the maximum value of the emission amount of light received by the light reception element 13 is selected. The second hold mode indicator 43 is turned on when a second hold mode for holding the minimum value of the emission amount of light received by the light reception element 13 is selected.

Figure 38:
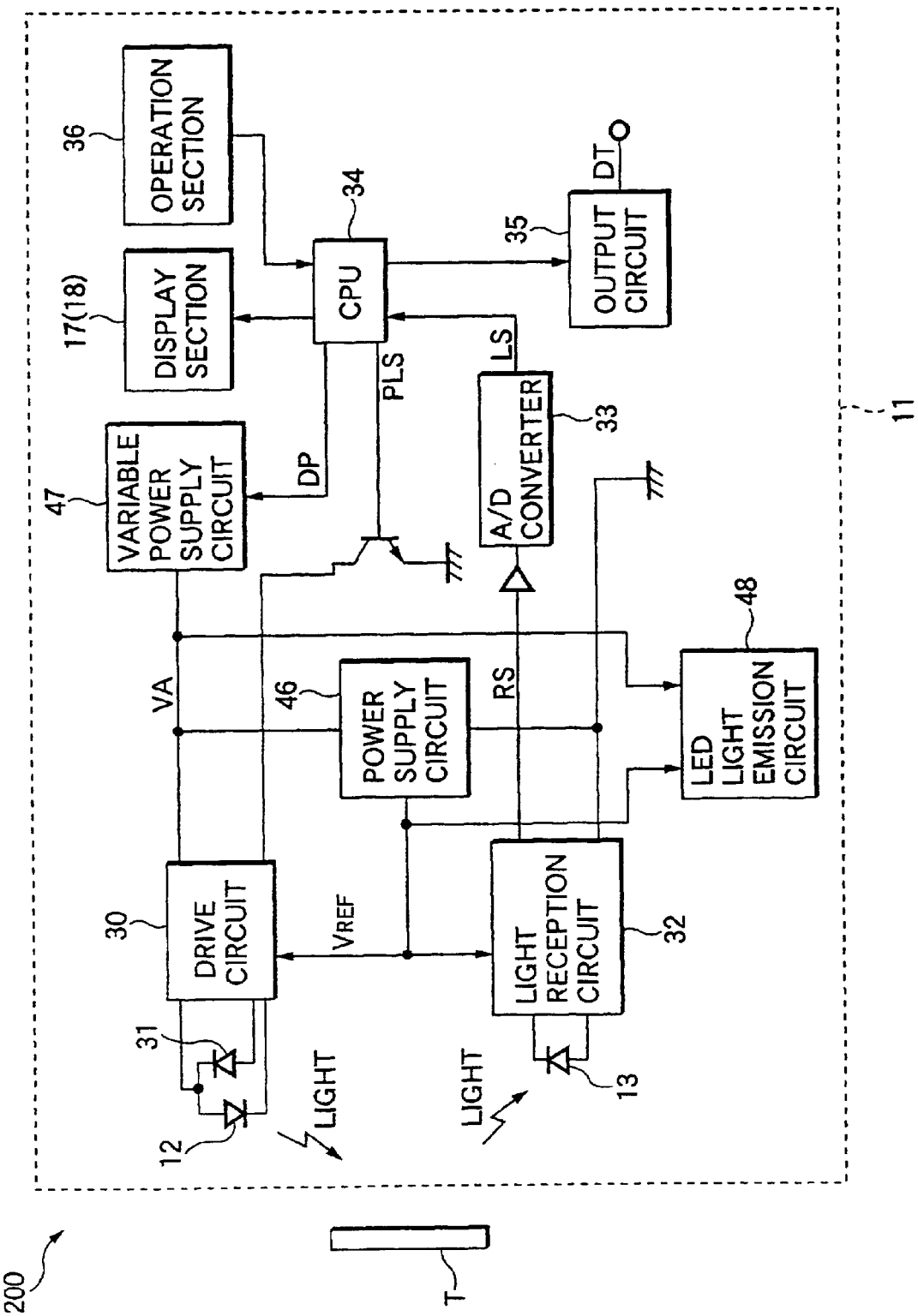
FIG. 38 is a circuit diagram of the laser-type photoelectric switch in FIG. 36.

FIG. 38 is a circuit diagram of the laser-type photoelectric switch 200 in FIG. 36. The photoelectric switch 200 in FIG. 36 adopts the laser light emission element and thus comprises a power supply circuit 46 and a variable power supply circuit 47 and also comprises a light emission circuit 48 for the bar LED monitor 40.

Figure 39:
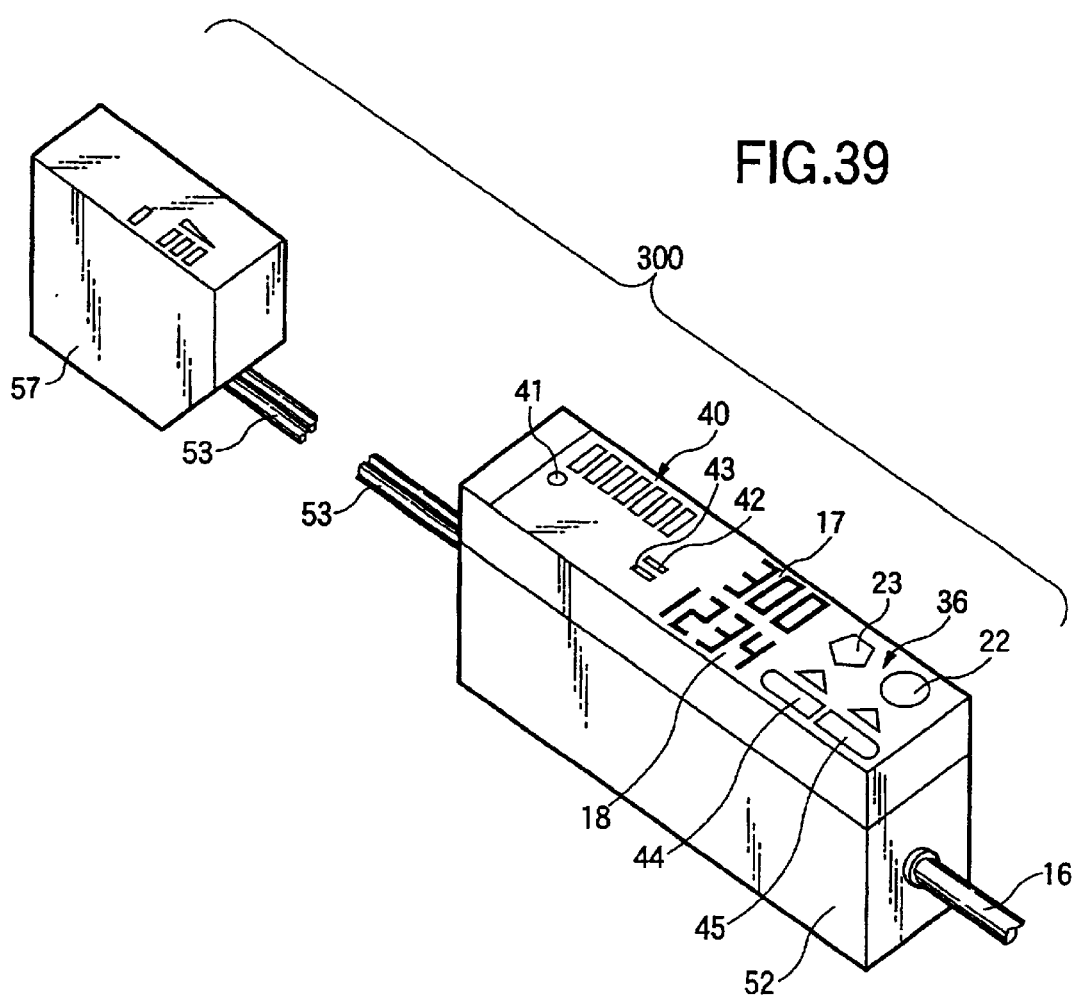
FIG. 39 is a perspective view of a separate-type photoelectric switch that can incorporate the present invention.

FIG. 39 shows a reflection-type and separate-type photoelectric switch 300. The photoelectric switch 300 includes a head unit 51 comprising a light emission element and a light reception element and a main unit 52 containing an amplifier, a CPU, etc. A cable 53 connects the head unit 51 and the main unit 52. First and second display sections 17 and 18 and an operation section 36 are placed on the main unit 52 of the photoelectric switch 300.

Figure 40:
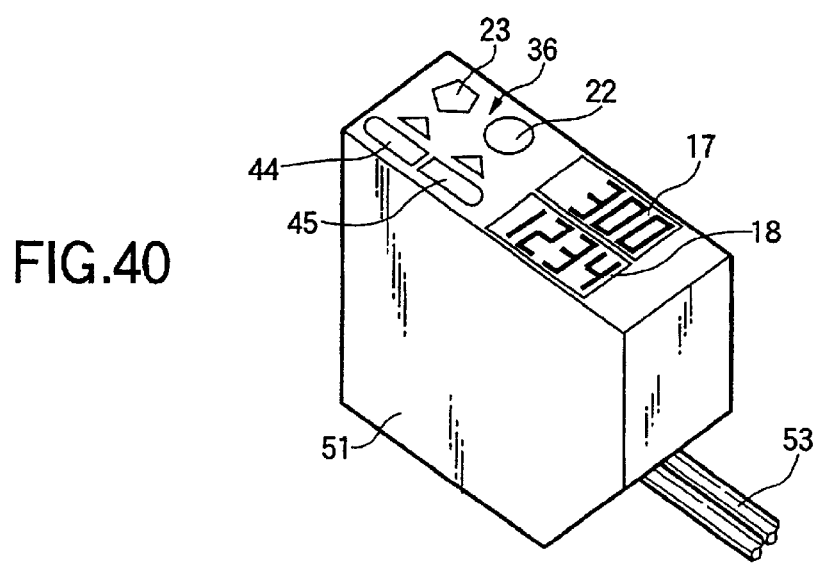
FIG. 40 is a perspective view of a head unit of a modified example of the photoelectric switch in FIG. 39 according to the present invention.

FIG. 40 is a modified example of the photoelectric switch 300 in FIG. 39, wherein the first and second display sections 17 and 18 are also placed on the head unit 51. The operation section 36 may also be placed on the head unit 51.

The invention has been described by taking the reflection-type photoelectric switch as an example, but it can also be applied to a transmission-type photoelectric switch wherein a light emission section and a light reception section are separated and light passing through a detected object is received at the light reception section. Also in the transmission-type photoelectric switch, the first and second display sections 17 and 18 or one display section 60 may be placed on either or both of the light reception section unit and the light emission section unit. An operation section 36 comprising various switches may be placed on either or both of the light reception section unit and the light emission section unit.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2001-073339 filed Mar. 15, 2001 is hereby incorporated by reference. The text of related U.S. application Ser. No. 10/055,033, titled PHOTOELECTRIC SWITCH and filed Jan. 25, 2002 is also hereby incorporated by reference.

What is claimed is:

1. A multifunctional photoelectric switch comprising:
 a display section for displaying one of a first display information and a second display information, the first display information including a plurality of items concerning a threshold value, the second display information including a plurality of items concerning functions of said photoelectric switch;
 a switch for switching information to be displayed on said display section between the first display information and the second display information, and
 wherein when the second display information is displayed on said display section, only a part of the plurality of items or all of the plurality of items in the second display information are sequentially displayed on said display section.

2. The photoelectric switch as claimed in claim 1, wherein when the first display information is displayed on said display section, only a part of the plurality of items or all of the plurality of items in the first display information are sequentially displayed on said display section.

3. The photoelectric switch as claimed in claim 2, wherein the first display information includes a second selection item for selecting only a part of the plurality of items or all of the plurality of items in the first display information to sequentially display on said display.

4. The photoelectric switch as claimed in claim 1, wherein said display section displays a first selection item for selecting only a part of the plurality of items or all of the plurality of items in the second display information to sequentially display on said display section when the information displayed on said display section is switched from the first display information to the second display information.

5. The photoelectric switch as claimed in claim 1, wherein said switch also switches items to be displayed on said display section.

6. A multifunctional photoelectric switch comprising:
 a display section for displaying one of a first display information, a second display information, and a third display information, the first display information including a plurality of items concerning a threshold value, the second display information including a plurality of items concerning functions of said photoelectric switch, the third display information including a plurality of items concerning displays of said photoelectric switch; and
 a switch for switching information to be displayed on said display section among the first display information, the second display information, and the third display information.

7. The photoelectric switch as claimed in claim 6, wherein when the first display information is displayed on said display section, only a part of the plurality of items or all of the plurality of items in the first display information are sequentially displayed on said display section.

8. The photoelectric switch as claimed in claim 7, wherein the third display information includes a third selection item for selecting only a part of the plurality of items or all of the plurality of items in the first display information to sequentially display the selected items on said display section.

9. The photoelectric switch as claimed in claim 6, wherein when the second display information is displayed on said display section, only a part of the plurality of items or all of the plurality of items in the second display information are sequentially displayed on said display section.

10. The photoelectric switch as claimed in claim 9, wherein said display section displays a fourth selection item for selecting only a part of the plurality of items or all of the plurality of items in the second display information or the third display information to sequentially display the selected items on said display section when the information displayed on said display section is switched from the first display information to the second display information.

11. The photoelectric switch as claimed in claim 6, wherein said switch also switches items to be displayed on said display section.

12. A multifunctional photoelectric switch comprising:
 a display section for displaying one of a first display information and a second display information, the first display information including a plurality of items concerning a threshold value, the second display information including items concerning basic operation setting of said photoelectric switch and items concerning the other operational settings of said photoelectric switch, the second display information further including a fifth selection item for selecting a first display information or the items concerning the other operational settings of said photoelectric switch in the second display information to display the selected items on said display section;
 a switch for switching information to be displayed on said display section between the first display information and the second display information, and
 wherein the fifth selection item is displayed on said display section after the items concerning basic operation setting of said photoelectric switch are displayed on said display section.

13. The photoelectric switch as claimed in claim 12, wherein said switch also switches items to be displayed on said display section.

14. A multifunctional photoelectric switch comprising:
 a display section for displaying one of a first display information and a second display information, the first display information including a first plurality of items concerning a threshold value, the second display information including a second plurality of items concerning functions of said photoelectric switch;
 a switch including means for switching information to be displayed on said display section between the first display information and the second display information, and means for sequentially displaying some of the second plurality of items and means for sequentially displaying all of the second plurality of items when the second display information is displayed on said display section.

15. The photoelectric switch as claimed in claim 14, further comprising means for sequentially displaying some of the first plurality of items and means for sequentially displaying all of the first plurality of items when the first display information is displayed on said display section.

16. The photoelectric switch as claimed in claim 15, further comprising a means for displaying a second selection item for selecting said means for sequentially displaying some of the first plurality of items and said means for sequentially displaying all of the first plurality of items.

17. The photoelectric switch as claimed in claim 14, further comprising a means for displaying a first selection item for selecting said means for sequentially displaying some of the second plurality of items and said means for sequentially displaying all of the second plurality of items when the information displayed on said display section is switched from the first display information to the second display information.

18. The photoelectric switch as claimed in claim 14, wherein said switch also switches the items to be displayed on said display section.

19. A multifunctional photoelectric switch comprising:

a display section for displaying one of a first display information, a second display information, and a third display information, the first display information including a plurality of items concerning a threshold value, the second display information including a plurality of items concerning functions of said photoelectric switch, the third display information including a plurality of items concerning displays of said photoelectric switch; and a switch including means for switching information to be displayed on said display section among the first display information, the second display information, and the third display information.

20. The photoelectric switch as claimed in claim 19, further comprising means for sequentially displaying some of the second plurality of items and means for sequentially displaying all of the second plurality of items when the second display information is displayed on said display section; and means for sequentially displaying some of the first plurality of items and means for sequentially displaying all of the first plurality of items when the first display information is displayed on said display section.

* * * * *